United States Patent
Huang et al.

(10) Patent No.: US 12,051,366 B2
(45) Date of Patent: Jul. 30, 2024

(54) DISPLAY PANEL INCLUDING A SHIELD ELECTRODE CONNECTED TO A CONSTANT VOLTAGE LINE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yao Huang, Beijing (CN); Weiyun Huang, Beijing (CN); Jianchang Cai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 208 days.

(21) Appl. No.: 17/610,527

(22) PCT Filed: Feb. 20, 2021

(86) PCT No.: PCT/CN2021/077084
§ 371 (c)(1),
(2) Date: Nov. 11, 2021

(87) PCT Pub. No.: WO2022/174420
PCT Pub. Date: Aug. 25, 2022

(65) Prior Publication Data
US 2023/0337465 A1  Oct. 19, 2023

(51) Int. Cl.
*G09G 3/3233* (2016.01)
*H10K 59/121* (2023.01)
(Continued)

(52) U.S. Cl.
CPC ....... *G09G 3/3233* (2013.01); *H10K 59/1213* (2023.02); *H10K 59/1216* (2023.02);
(Continued)

(58) Field of Classification Search
None
See application file for complete search history.

(56) References Cited

U.S. PATENT DOCUMENTS

| 2008/0062373 A1 | 3/2008 | Kim et al. |
| 2008/0204619 A1* | 8/2008 | Saitou ............... G02F 1/136204 |
| | | 257/E27.009 |

(Continued)

FOREIGN PATENT DOCUMENTS

| CN | 107731144 A | 2/2018 |
| CN | 108597374 A | 9/2018 |

(Continued)

OTHER PUBLICATIONS

Extended European Search Report for corresponding European Application No. 21926138.5, dated Jun. 6, 2023.

(Continued)

*Primary Examiner* — Kirk W Hermann
(74) *Attorney, Agent, or Firm* — Leason Ellis LLP

(57) ABSTRACT

The display panel includes: a base substrate; a pixel unit, located on the base substrate, the pixel unit including a pixel circuit and a light-emitting element, wherein the pixel circuit is configured to drive the light-emitting element, the pixel circuit includes a driving transistor, and the driving transistor includes a gate electrode; a first gate signal line, connected to the gate electrode of the driving transistor; a constant voltage line, configured to provide a first constant voltage to the pixel circuit; and a shield electrode, connected to the constant voltage line, wherein an orthographic projection of the first gate signal line on the base substrate falls (Continued)

within an orthographic projection of the shield electrode on the base substrate.

18 Claims, 15 Drawing Sheets

(51) Int. Cl.
*H10K 59/126* (2023.01)
*H10K 59/131* (2023.01)
*H10K 59/65* (2023.01)

(52) U.S. Cl.
CPC ......... *H10K 59/126* (2023.02); *H10K 59/131* (2023.02); *H10K 59/65* (2023.02); *G09G 2300/0408* (2013.01); *G09G 2300/0819* (2013.01); *G09G 2300/0842* (2013.01); *G09G 2300/0861* (2013.01); *G09G 2310/0202* (2013.01); *G09G 2310/08* (2013.01)

(56) References Cited

U.S. PATENT DOCUMENTS

| | | | |
|---|---|---|---|
| 2016/0043159 A1* | 2/2016 | Kim | H10K 59/131 257/71 |
| 2016/0329392 A1* | 11/2016 | Miyake | G09G 3/3258 |
| 2018/0047799 A1* | 2/2018 | Lim | H10K 59/123 |
| 2018/0114824 A1 | 4/2018 | Lee et al. | |
| 2018/0331124 A1* | 11/2018 | Cho | H10K 59/126 |
| 2019/0325186 A1 | 10/2019 | Gao et al. | |
| 2020/0194529 A1* | 6/2020 | Lee | H01L 28/60 |
| 2021/0012706 A1* | 1/2021 | Yang | G09G 3/32 |
| 2021/0143241 A1 | 5/2021 | Kim et al. | |
| 2021/0151540 A1 | 5/2021 | Wang | |
| 2021/0296419 A1 | 9/2021 | Xu et al. | |
| 2021/0328000 A1 | 10/2021 | Jia et al. | |
| 2021/0359080 A1* | 11/2021 | Xu | H10K 59/121 |
| 2022/0165827 A1* | 5/2022 | Xu | H10K 59/1201 |
| 2022/0181354 A1 | 6/2022 | Lee et al. | |
| 2022/0202421 A1* | 6/2022 | Holsten | A61B 17/083 |
| 2022/0310742 A1* | 9/2022 | Yi | H10K 59/131 |

FOREIGN PATENT DOCUMENTS

| | | | | |
|---|---|---|---|---|
| CN | 109697958 A | | 4/2019 | |
| CN | 110114885 A | | 8/2019 | |
| CN | 110299384 A | | 10/2019 | |
| CN | 110767739 A | * | 2/2020 | |
| CN | 111293126 A | | 6/2020 | |
| CN | 111833720 A | | 10/2020 | |
| CN | 111834375 A | | 10/2020 | |
| CN | 109697958 B | * | 11/2020 | ........... G09G 3/3208 |
| CN | 112103318 A | | 12/2020 | |
| CN | 112271203 A | | 1/2021 | |
| CN | 113451360 A | | 9/2021 | |

OTHER PUBLICATIONS

Office Action in U.S. Appl. No. 18/018,876, mailed Nov. 15, 2023, 37 pages.

* cited by examiner

DISPLAY PANEL INCLUDING A SHIELD ELECTRODE CONNECTED TO A CONSTANT VOLTAGE LINE AND DISPLAY DEVICE

CROSS-REFERENCE TO RELATED PATENT APPLICATIONS

This application is a U.S. National Stage Application under 35 U.S.C. § 371 of International Patent Application No. PCT/CN2021/077084 filed Feb. 20, 2021, which is incorporated by reference in its entirety.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure provides a display panel and a display device.

At least one embodiment of the present disclosure provides a display panel, comprising: a base substrate; a pixel unit, located on the base substrate, the pixel unit comprising a pixel circuit and a light-emitting element, wherein the pixel circuit is configured to drive the light-emitting element, the pixel circuit comprises a driving transistor, and the driving transistor comprises a gate electrode; a first gate signal line, connected to the gate electrode of the driving transistor; a constant voltage line, configured to provide a first constant voltage to the pixel circuit; and a shield electrode, connected to the constant voltage line, wherein an orthographic projection of the first gate signal line on the base substrate falls within an orthographic projection of the shield electrode on the base substrate.

For example, the orthographic projection of the shield electrode on the base substrate covers the orthographic projection of the first gate signal line on the base substrate, and an area of the orthographic projection of the shield electrode on the base substrate is larger than an area of the orthographic projection of the first gate signal line on the base substrate.

For example, a distance between a boundary of the orthographic projection of the first gate signal line on the base substrate and a boundary of the orthographic projection of the shield electrode on the base substrate is greater than or equal to 1.75 μm.

For example, an orthographic projection of the gate electrode of the driving transistor on the base substrate falls within the orthographic projection of the shield electrode on the base substrate.

For example, the display panel further comprises a second gate signal line, wherein the second gate signal line is connected to the first gate signal line, and an orthographic projection of the second gate signal line on the base substrate falls within the orthographic projection of the shield electrode on the base substrate.

For example, a material of the first gate signal line is different from a material of the second gate signal line.

For example, the material of the first gate signal line comprises a metal, and the material of the second gate signal line comprises an electrically conductive material formed by conducting a semiconductor material.

For example, the pixel circuit further comprises a first reset transistor and a first initialization signal line, the first reset transistor is connected to a second gate signal line, a first electrode of the first reset transistor is connected to the first initialization signal line, and the second gate signal line is multiplexed as a second electrode of the first reset transistor.

For example, the constant voltage line comprises the first initialization signal line.

For example, the display panel further comprises a first power supply line, wherein the first power supply line is configured to provide a first power supply voltage to the pixel circuit, the pixel circuit further comprises a storage capacitor, a first terminal of the storage capacitor is connected to the gate electrode of the driving transistor, and a second terminal of the storage capacitor is connected to the first power supply line.

For example, the constant voltage line comprises the first power supply line.

For example, the display panel further comprises a third power supply line, wherein the third power supply line is connected in parallel with the first power supply line, the shield electrode and the third power supply line are formed as an integrated structure, and the third power supply line and the first power supply line extend in the same direction.

For example, the display panel comprises a first display region and a second display region, the first display region is located on at least one side of the second display region, the pixel unit comprises a first pixel unit and a second pixel unit, a pixel circuit and a light-emitting element of the first pixel unit are both located in the first display region, a pixel circuit of the second pixel unit is located in the first display region, a light-emitting element of the second pixel unit is located in the second display region, the pixel circuit of the second pixel unit is connected to the light-emitting element of the second pixel unit through a conductive line, an orthographic projection of the conductive line on the base substrate partially overlaps with an orthographic projection of the pixel circuit of the first pixel unit on the base substrate, and the shield electrode is located between the conductive line and the first gate signal line in a direction perpendicular to the base substrate.

For example, the orthographic projection of the conductive line on the base substrate partially overlaps with an orthographic projection of the first gate signal line, which is located in the pixel circuit of the first pixel unit, on the base substrate.

For example, the display panel further comprises a gate line and a data line, wherein the gate line is configured to provide a scan signal to the pixel circuit, and the data line is configured to provide a data signal to the pixel circuit; and the pixel circuit further comprises a data writing transistor, a gate electrode of the data writing transistor is connected to the gate line, a first electrode of the data writing transistor is connected to the data line, and a second electrode of the data writing transistor is connected to a first electrode of the driving transistor.

For example, the display panel further comprises a block, wherein the block is connected to the first power supply line, the pixel circuit further comprises a threshold compensation transistor, a first electrode of the threshold compensation transistor is connected to a second electrode of the driving transistor, a second electrode of the threshold compensation transistor is connected to the gate electrode of the driving transistor, and a gate electrode of the threshold compensation transistor is connected to the gate line; the gate electrode of the driving transistor is connected to the second electrode of the threshold compensation transistor through the first gate signal line, the threshold compensation transistor comprises a first channel and a second channel, and the first channel and the second channel are connected with each other by a conductive connection portion; and an orthographic projection of the block on the base substrate at least partially overlaps with an orthographic projection of the conductive connection portion of the threshold compensation transistor on the base substrate.

For example, the orthographic projection of the block on the base substrate partially overlaps with the orthographic projection of the second gate signal line on the base substrate.

For example, the display panel further comprises a second reset control signal line, wherein the pixel circuit further comprises a second reset transistor, a gate electrode of the second reset transistor is connected to the second reset control signal line, a first electrode of the second reset transistor is connected to a second initialization signal line, and a second electrode of the second reset transistor is connected to a first electrode of the light-emitting element.

For example, the display panel further comprises a light-emitting control signal line, wherein the pixel circuit further comprises a first light-emitting control transistor and a second light-emitting control transistor, a gate electrode of the first light-emitting control transistor is connected to the light-emitting control signal line, a first electrode of the first light-emitting control transistor is connected to the first power supply line, and a second electrode of the first light-emitting control transistor is connected to the first electrode of the driving transistor; and a gate electrode of the second light-emitting control transistor is connected to the light-emitting control signal line, a first electrode of the second light-emitting control transistor is connected to the second electrode of the driving transistor, and a second electrode of the second light-emitting control transistor is connected to the first electrode of the light-emitting element.

At least one embodiment of the present disclosure provides a display device, comprising the aforementioned display panel.

For example, the display device further comprises a sensor, wherein the sensor is located on one side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
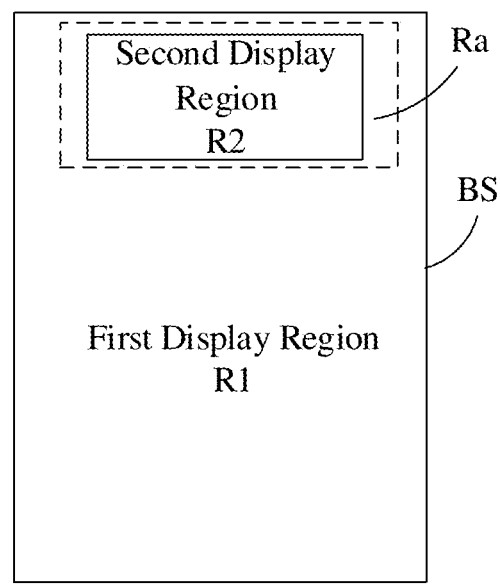
FIG. 1 is a schematic structural diagram of a display panel provided by an embodiment of the present disclosure.

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With the development of display technology, the existing notch screen or water drop screen design gradually cannot meet user's demand for a high screen-to-body ratio of a display panel, and a series of display panels with light-transmitting display regions have emerged as the times require. In this type of display panel, hardware such as a photosensitive sensor (for example, a camera) can be disposed in the light-transmitting display region. Because there is no need to punch holes, it is possible to realize a true full screen on the premise of ensuring the practicability of the display panel.

In a related art, a display panel with an under-screen camera generally includes a first display region for normal display and a second display region for disposing a camera. The second display region generally includes a plurality of light-emitting elements and a plurality of pixel circuits. Each pixel circuit is connected to a light-emitting element and used to drive the light-emitting element to emit light, and the pixel circuit and the light-emitting element connected to each other overlap with each other in a direction perpendicular to the display panel.

Because pixel circuits are also disposed in the second display region in the related art, the light transmittance of the second display region is poor, and accordingly, the display effect of the display panel is poor.

FIG. 1 is a schematic structural diagram of a display panel provided by an embodiment of the present disclosure. As illustrated in FIG. 1, the display panel includes a base substrate BS. The display panel includes a first display region R1 and a second display region R2, and the first display region R1 may be located on at least one side of the second display region R2. For example, in some embodiments, the first display region R1 surrounds the second display region R2. That is, the second display region R2 may be surrounded by the first display region R1. The second display region R2 can also be arranged at other positions, and the arrangement position of the second display region R2 can be determined according to needs. For example, the second display region R2 may be located at the top middle position of the base substrate BS, or may be located at the upper left position or the upper right position of the base substrate BS. For example, hardware such as a photosensitive sensor (for example, a camera) is disposed in the second display region R2 of the display panel. For example, the second display region R2 is a light-transmitting display region, and the first display region R1 is a display region. For example, the first display region R1 is opaque and only used for display.

Figure 2:
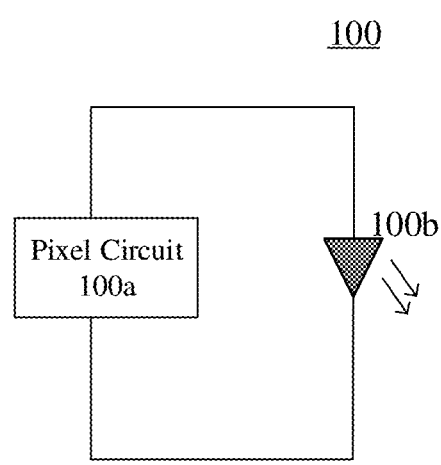
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100, and the pixel unit 100 is located on a base substrate. As illustrated in FIG. 2, the pixel unit 100 includes a pixel circuit 100*a* and a light-emitting element 100*b*, and the pixel circuit 100*a* is configured to drive the light-emitting element 100*b*. For example, the pixel circuit 100*a* is configured to provide a driving current to drive the light-emitting element 100*b* to emit light. For example, the light-emitting element 100*b* is an organic light-emitting diode (OLED), and the light-emitting element 100*b* emits red light, green light, blue light, or white light under the driving of its corresponding pixel circuit 100*b*. The light-emitting color of the light-emitting element 100*b* can be determined according to needs.

In order to increase the light transmittance of the second display region R2, only light-emitting elements may be disposed in the second display region R2, and pixel circuits for driving the light-emitting elements of the second display region R2 may be disposed in the first display region RE That is, the light transmittance of the second display region R2 is improved by the way that the light-emitting elements and the pixel circuits are separately disposed.

Figure 3:
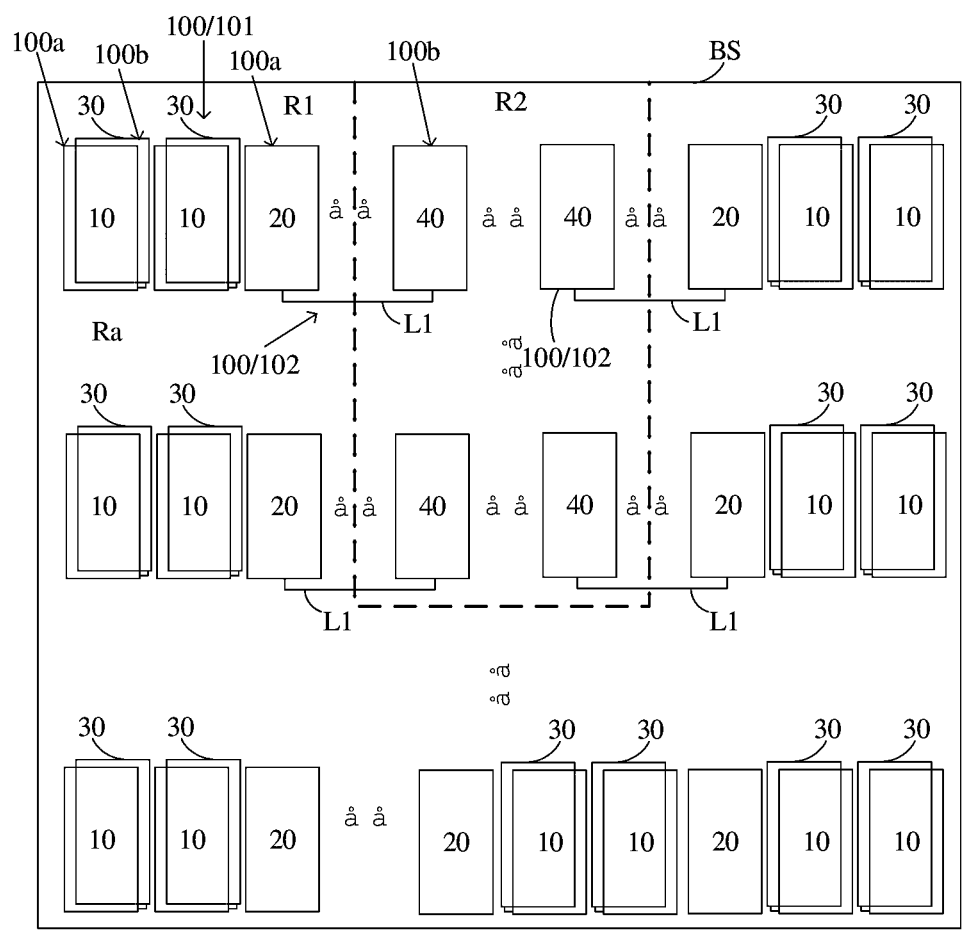
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes a plurality of first pixel circuits 10, a plurality of second pixel circuits 20, and a plurality of first light-emitting elements 30 located in a first display region R1, and a plurality of second light-emitting elements 40 located in a second display region R2. For example, the plurality of second pixel circuits 20 may be distributed among the plurality of first pixel circuits 10 at intervals.

For example, as illustrated in FIG. 3, at least one first pixel circuit 10 of the plurality of first pixel circuits 10 is connected to at least one first light-emitting element 30 of the plurality of first light-emitting elements 30, and an orthographic projection of the at least one first pixel circuit 10 on the base substrate BS at least partially overlaps with an orthographic projection of the at least one first light-emitting element 30 on the base substrate BS. The at least one first pixel circuit 10 can be used to provide a driving signal for the connected first light-emitting element 30 to drive the first light-emitting element 30 to emit light.

For example, as illustrated in FIG. 3, at least one second pixel circuit 20 of the plurality of second pixel circuits 20 is connected to at least one second light-emitting element 40 of the plurality of second light-emitting elements 40 through a conductive line L1, and the at least one second pixel circuit 20 can be used to provide a driving signal for the connected second light-emitting element 40 to drive the second light-emitting element 40 to emit light. As illustrated in FIG. 3, because the second light-emitting element 40 and the second pixel circuit 20 are located in different regions, there is no overlap between an orthographic projection of the at least one second pixel circuit 20 on the base substrate BS and an orthographic projection of the at least one second light-emitting element 40 on the base substrate BS.

For example, in the embodiments of the present disclosure, the first display region R1 can be set as an opaque display region, and the second display region R2 can be set as a light-transmitting display region. For example, the first display region R1 cannot transmit light, and the second display region R2 can transmit light. In this way, the display panel provided by the embodiment of the present disclosure does not need to perform drilling processing on the display panel, and the required hardware structure such as the photosensitive sensor can be directly arranged at a position corresponding to the second display region R2 on one side of the display panel, which lays a solid foundation for the realization of a true full screen. In addition, because the second display region R2 only includes light-emitting elements and does not include pixel circuits, it is beneficial to increase the light transmittance of the second display region R2, so that the display panel has a better display effect.

As illustrated in FIG. 3, the pixel unit 100 includes a first pixel unit 101 and a second pixel unit 102. A pixel circuit 100*a* and a light-emitting element 100*b* of the first pixel unit 101 are both located in the first display region R1, a pixel circuit 100*a* of the second pixel unit 102 is located in the first display region R1, and a light-emitting element 100*b* of the second pixel unit 102 is located in the second display region R2. In the embodiments of the present disclosure, the pixel circuit 100*a* of the first pixel unit 101 is the first pixel circuit 10, the light-emitting element 100*b* of the first pixel unit 101 is the first light-emitting element 30, the pixel circuit 100*a* of the second pixel unit 101 is the second pixel circuit 20, and the light-emitting element 100b of the second pixel unit 102 is the second light-emitting element 40. For example, the first light-emitting element 30 may be referred to as an in-situ light-emitting element. For example, the first pixel circuit 10 may be referred to as an in-situ pixel circuit, and the second pixel circuit 20 may be referred to as an ex-situ pixel circuit.

For example, as illustrated in FIG. 3, the second light-emitting element 40 and the second pixel circuit 20 connected to the second light-emitting element 40 are located in the same row. That is, the light-emitting signal of the second light-emitting element 40 comes from the second pixel circuit in the same row. For example, pixel circuits of pixel units in the same row are connected to the same gate line.

As illustrated in FIG. 3, the pixel circuit (the second pixel circuit 20) of the second pixel unit 102 is connected to the light-emitting element (the second light-emitting element 40) of the second pixel unit 102 through the conductive line L1. For example, the conductive line L1 is made of a transparent conductive material. For example, the conductive line L1 is made of conductive oxide material. For example, the conductive oxide material includes indium tin oxide (ITO), but is not limited thereto.

As illustrated in FIG. 3, one terminal of the conductive line L1 is connected to the second pixel circuit 20, and the other terminal of the conductive line L1 is connected to the second light-emitting element 40. As illustrated in FIG. 3, the conductive line L1 extends from the first display region R1 to the second display region R2.

As illustrated in FIG. 1 and FIG. 3, in some embodiments, the display panel further includes an auxiliary region Ra, and the auxiliary region Ra can be provided with the second pixel circuit 20.

Figure 4:
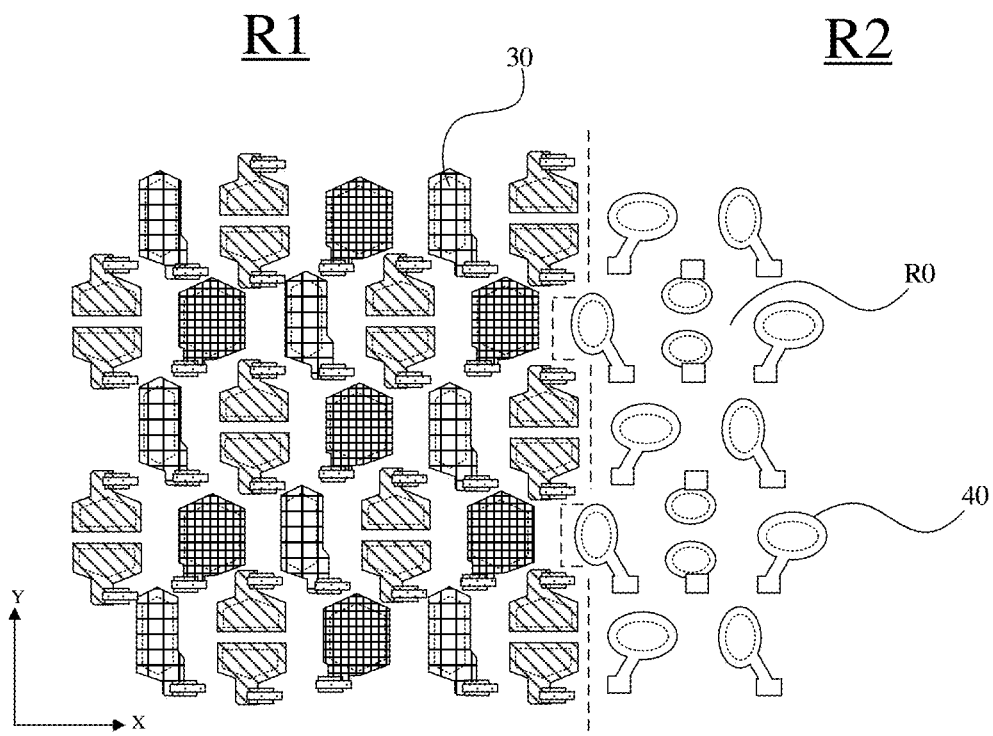
FIG. 4 is a schematic diagram of a first display region and a second display region in a display panel provided by an embodiment of the present disclosure.

FIG. 4 is a schematic diagram of the first display region and the second display region in the display panel provided by an embodiment of the present disclosure. As illustrated in FIG. 4, in the second display region R2, a light-transmitting region R0 is disposed between adjacent second light-emitting elements 40. For example, as illustrated in FIG. 4, a plurality of light-transmitting regions R0 are connected to each other to form a continuous light-transmitting region separated by a plurality of second light-emitting elements 40. The conductive wire L1 is made of a transparent conductive material to increase the light transmittance of the light-transmitting region R0 as much as possible. As illustrated in FIG. 4, the region of the second display region R2 except for the second light-emitting element 40 may be a light-transmitting region.

FIG. 5A to FIG. 5E are partial plan views of a display panel provided by an embodiment of the present disclosure. FIG. 5A to FIG. 5E are described below.

Figure 5A:
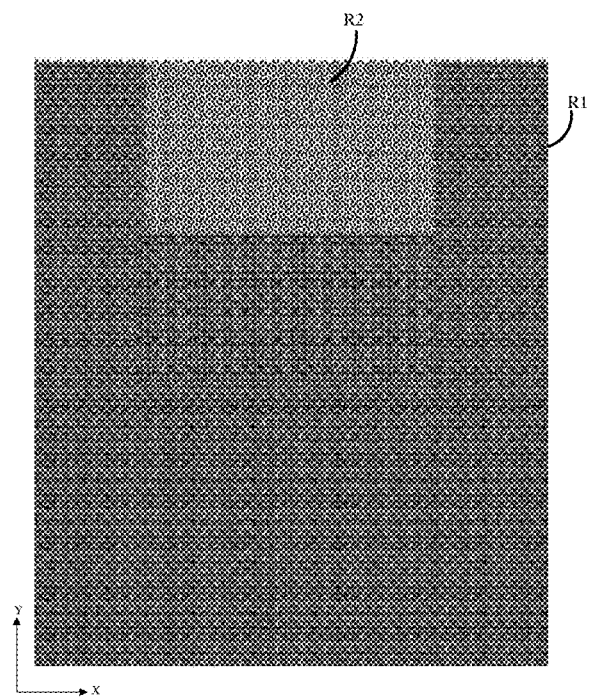
FIG. 5A to FIG. 5E are partial plan views of a display panel provided by an embodiment of the present disclosure.

FIG. 5A is a schematic diagram of a first display region and a second display region of a display panel provided by an embodiment of the present disclosure. As illustrated in FIG. 5A, the second display region R2 is a light-transmitting display region, and the first display region R1 is a display region.

Figure 5B:
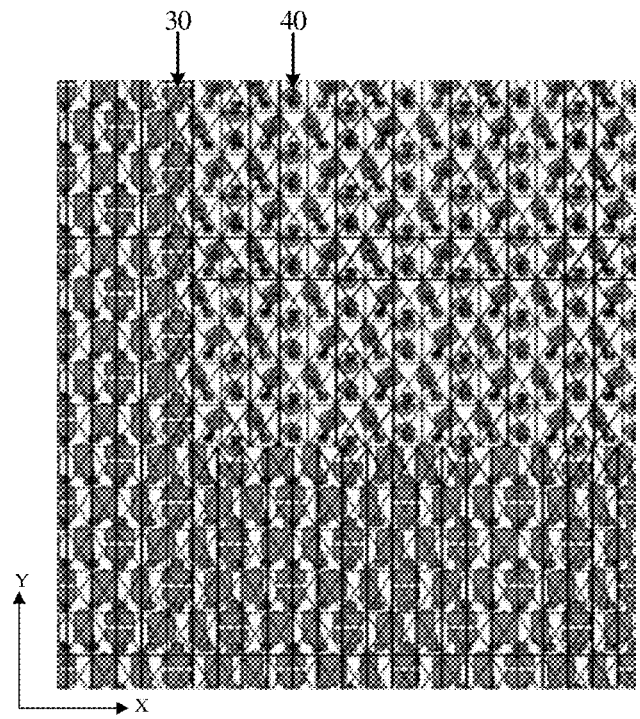

FIG. 5B is a schematic diagram of a first light-emitting element in a first display region and a second light-emitting element in a second display region of a display panel provided by an embodiment of the present disclosure. FIG. 5B illustrates the first light-emitting element 30 and the second light-emitting element 40.

Referring to FIG. 5A, FIG. 5B, and FIG. 3, in order to improve the display effect, the density of the second light-emitting element 40 may be equal to the density of the first light-emitting element 30. That is, the resolution of the second display region R2 is the same as the resolution of the first display region RE Of course, in other embodiments, the density of the second light-emitting element 40 may be greater or less than the density of the first light-emitting element 30. That is, the resolution of the second display region R2 may be greater or less than the resolution of the first display region RE For example, as illustrated in FIG. 5B and FIG. 4, the light-emitting area of the second light-emitting element 40 is smaller than the light-emitting area of the first light-emitting element 30. FIG. 4 illustrates the light-emitting area of the second light-emitting element 40 and the light-emitting area of the first light-emitting element 30 with broken lines. For example, the light-emitting area of a light-emitting element may correspond to the area of the opening of a pixel definition layer.

Figure 5C:
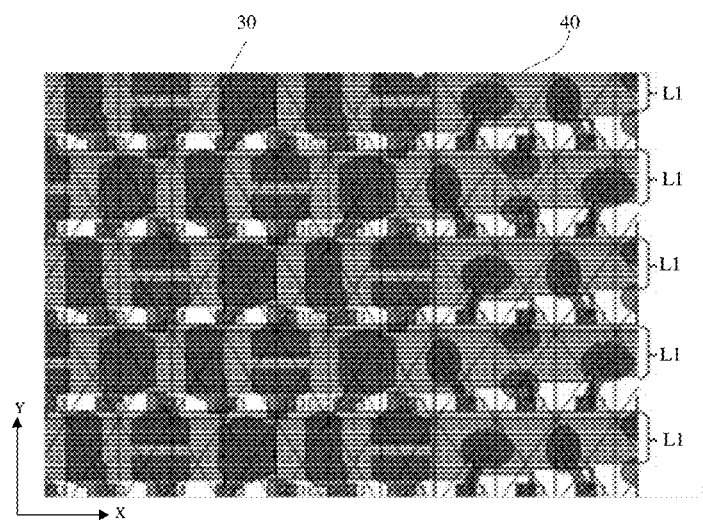

FIG. 5C is a schematic diagram of conductive lines in a display panel provided by an embodiment of the present disclosure. FIG. 5C illustrates a plurality of conductive lines L1.

Figure 5D:
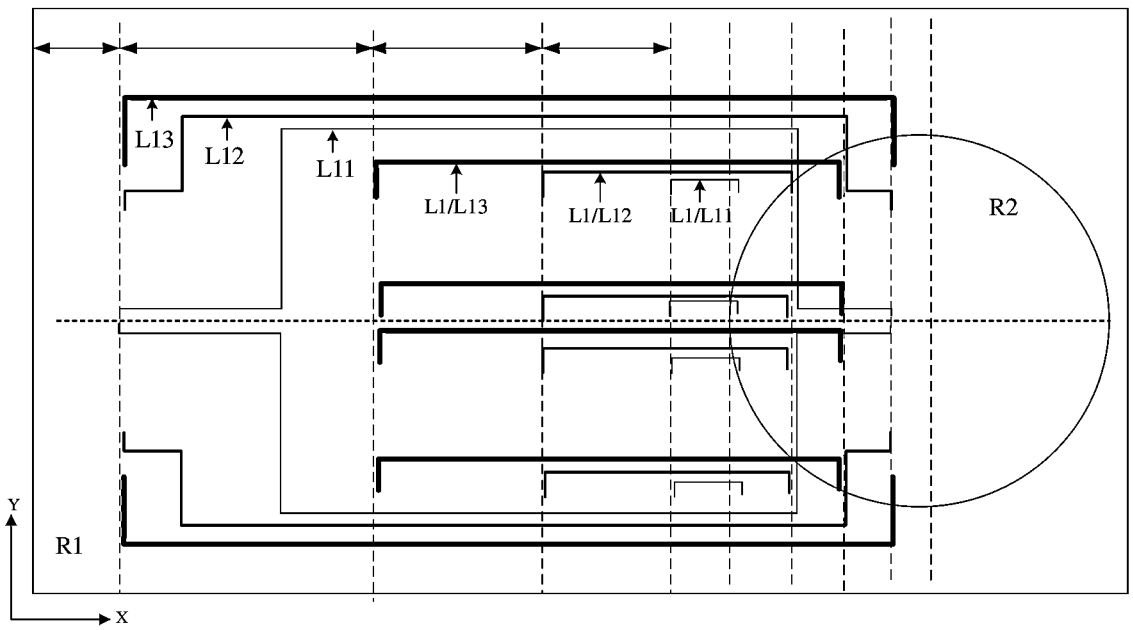

FIG. 5D is a schematic diagram of conductive lines in a display panel provided by an embodiment of the present disclosure. FIG. 5D illustrates the conductive line L1. As illustrated in FIG. 5D, the conductive line L1 includes a first conductive line L11, a second conductive line L12, and a third conductive line L13. In a display panel with a high PPI, in order to avoid too dense conductive lines, a plurality of conductive line pattern layers may be formed, and an insulating layer is arranged between the different conductive line pattern layers. For example, the first conductive line L11 is located in a first conductive line pattern layer, the second conductive line L12 is located in a second conductive line pattern layer, and the third conductive line L13 is located in a third conductive line pattern layer. Of course, in other embodiments, a plurality of conductive lines in other forms can also be provided. For example, one conductive line L1 is formed by several conductive parts located in different conductive line pattern layers. For example, the several conductive parts located in different conductive line pattern layers may be connected to one another through via holes penetrating an insulating layer.

Figure 5E:
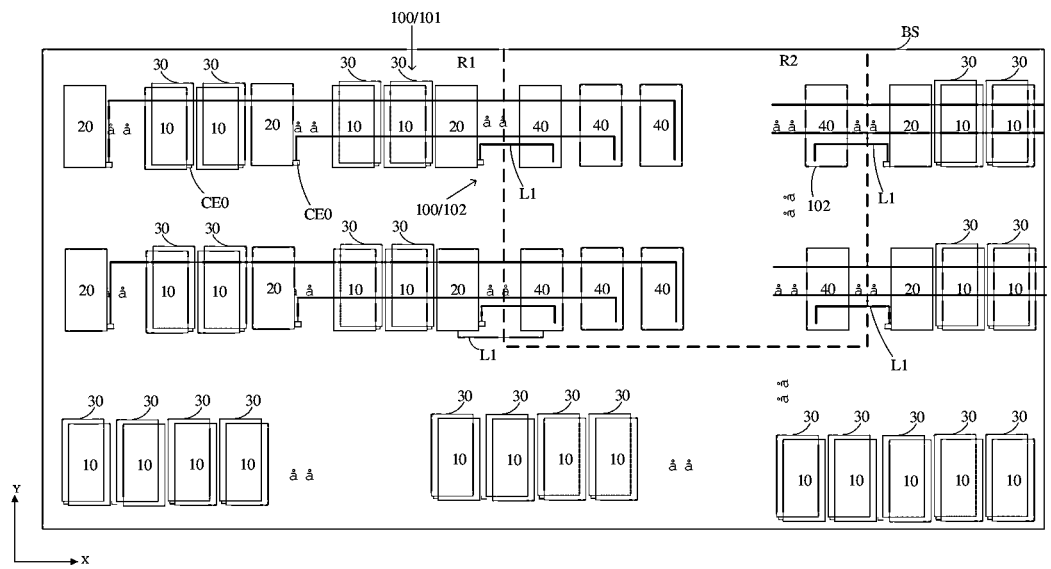

FIG. 5E illustrates the first light-emitting element 30, the second light-emitting element 40, the first pixel circuit 10, the second pixel circuit 20, a connecting element CE0, and the conductive line L1. Each pixel circuit is connected to a light-emitting element through a connecting element CE0. That is, each pixel unit has one connection element CE0. That is, the first pixel circuit 10 is connected to the first light-emitting element 30 through the connecting element CE0, and the second pixel circuit 20 is connected to the second light-emitting element 40 through the connecting element CE0. For example, one terminal of the conductive line L1 is connected to the second pixel circuit 20 through the connecting element CE0, and the other terminal of the conductive line L1 is connected to the second light-emitting element 40.

As illustrated in FIG. 5E, one conductive line L1 passes through the region where the pixel circuit of the pixel unit is located to respectively connect the second pixel circuit 20 and the second light-emitting element 40 on both sides of the pixel unit. For example, the region where the pixel circuit of the pixel unit is located overlaps with a plurality of conductive lines L1 passing through the region, so that the pixel circuit and the conductive lines overlapping with the pixel circuit are coupled to form a parasitic capacitance, which causes a difference in brightness to form a display defect such as stripes (Mura). The region in the first display region R1 where the second pixel circuit 20 is disposed can be called the auxiliary region Ra (as illustrated in FIG. 1 and FIG. 3), and the auxiliary region Ra can also be called a transition region, due to the coupling of the conductive line and the pixel circuit, the auxiliary region (transition region) tends to have darker brightness, and the darker pixel unit is the pixel unit (first pixel unit) in the first display region R1, not the second light-emitting element 40 in the second display region R2. For example, the case of that the auxiliary region is darker is more obvious in the case of high gray scale than in the case of low gray scale. In FIG. 5E, one first pixel circuit 10 overlaps with two conductive lines L1 at most as an example. In other embodiments, one first pixel circuit 10 may also overlap with more conductive lines L1. For example, as illustrated in FIG. 5C, in some embodiments, one first pixel circuit 10 may overlap with 10-15 conductive lines L1. How many conductive lines L1 overlap with one first pixel circuit 10 can be determined according to needs.

In some embodiments, the size of the first pixel circuit 10 can be compressed in the first direction X to obtain the region where the second pixel circuit 20 is disposed. For example, as illustrated in FIG. 5E, in the auxiliary region, one column of second pixel circuits 20 are disposed between every one or more columns of first pixel circuits 10 are disposed. For example, the number of columns of first pixel circuits 10 between two adjacent columns of second pixel circuits 20 can be determined according to needs.

Figure 6A:
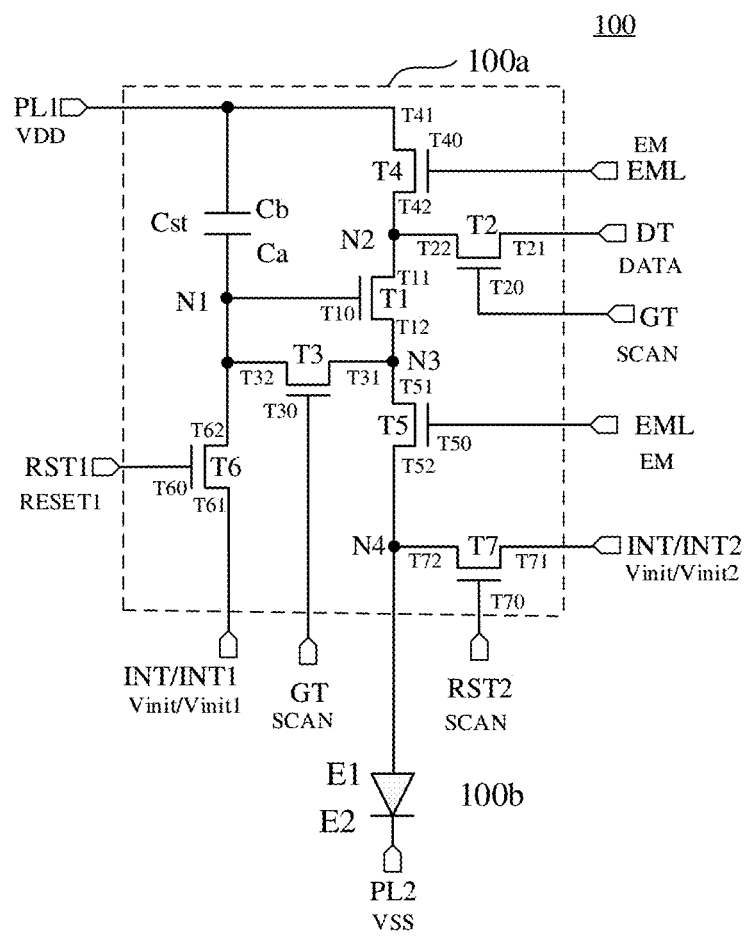
FIG. 6A is a schematic diagram of a pixel circuit provided by an embodiment of the present disclosure.
Figures 6B, 6C:
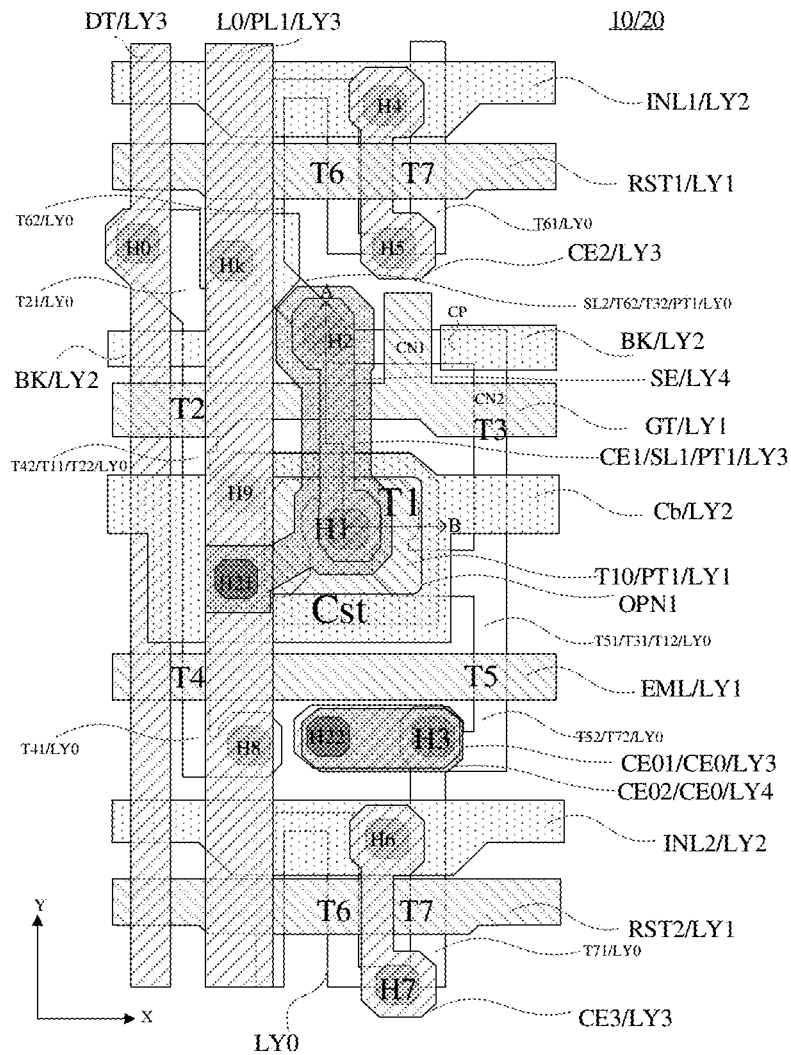
FIG. 6B is a layout diagram of a pixel circuit provided by an embodiment of the present disclosure.
FIG. 6C is a cross-sectional view taken along the line A-B of FIG. 6B.
Figure 6D:
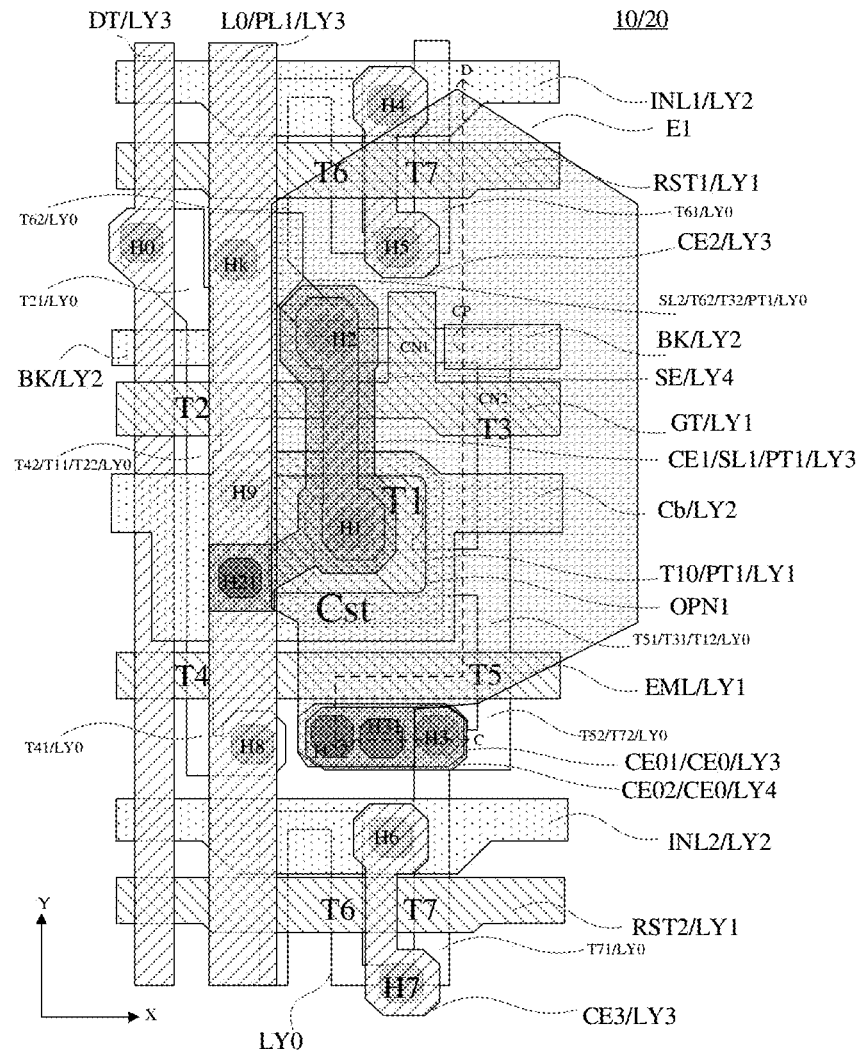
FIG. 6D is a layout diagram of a pixel circuit provided by an embodiment of the present disclosure.
Figure 6E:
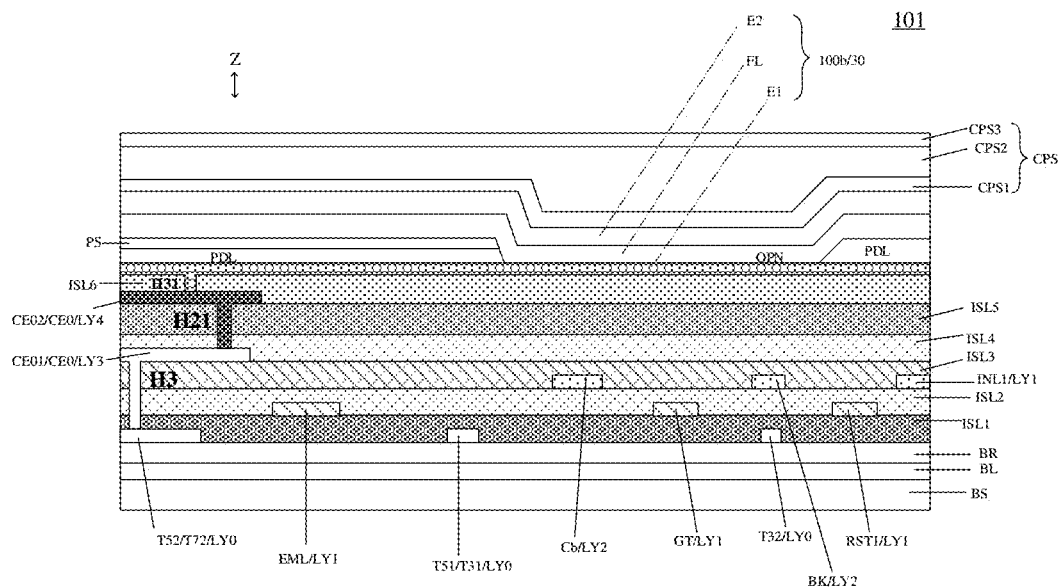
FIG. 6E is a cross-sectional view taken along the line C-D of FIG. 6D.
Figure 6F:
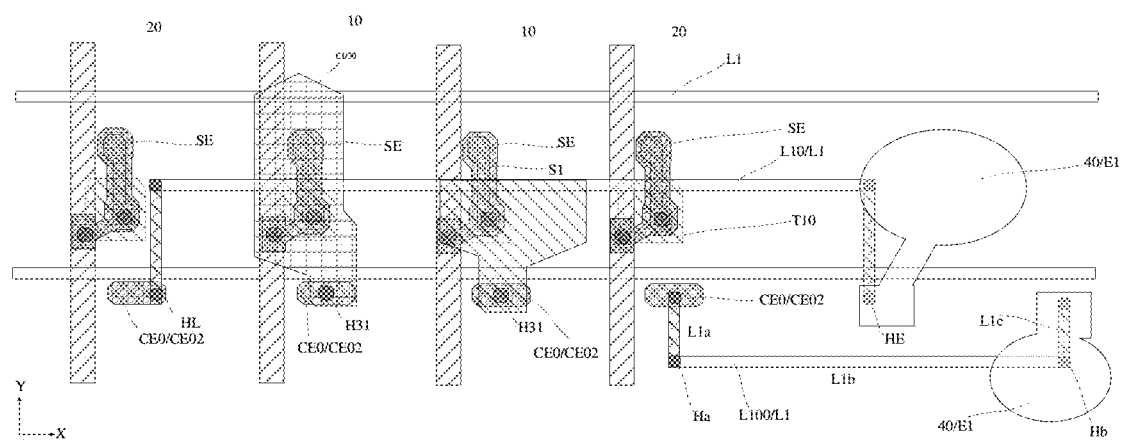
FIG. 6F is a partial schematic diagram of a display panel provided by an embodiment of the present disclosure.

FIG. 6A is a schematic diagram of a pixel circuit in a display panel provided by an embodiment of the present disclosure. FIG. 6B is a layout diagram of a pixel circuit in a display panel provided by an embodiment of the present disclosure. FIG. 6C is a cross-sectional view taken along the line A-B of FIG. 6B. FIG. 6D is a layout diagram of a pixel circuit in a display panel provided by an embodiment of the present disclosure. FIG. 6E is a cross-sectional view taken along the line C-D of FIG. 6D. FIG. 6F is a partial schematic diagram of a display panel provided by an embodiment of the present disclosure.

The pixel circuit illustrated in FIG. 6A may be a low temperature polysilicon (LTPS) AMOLED pixel circuit commonly used in the related art.

FIG. 6A illustrates a pixel circuit of one pixel unit of the display panel. As illustrated in FIG. 6A, the pixel unit 100 includes the pixel circuit 100a and the light-emitting element 100b. The pixel circuit 100a includes six switching transistors (T2-T7), one driving transistor T1, and one storage capacitor Cst. The six switching transistors are respectively a data writing transistor T2, a threshold compensation transistor T3, a first light-emitting control transistor T4, a second light-emitting control transistor T5, a first reset transistor T6, and a second reset transistor T7. The light-emitting element 100b includes a first electrode E1 and a second electrode E2, and a light-emitting function layer located between the first electrode E1 and the second electrode E2. For example, the first electrode E1 is an anode, and the second electrode E2 is a cathode. Generally, the threshold compensation transistor T3 and the first reset transistor T6 reduce leakage current by adopting double-gate thin film transistors (TFT).

As illustrated in FIG. 6A, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 6A, the driving transistor T1 is electrically connected to the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light emitting diode (OLED), and the light-emitting element 100b emits red light, green light, blue light, or white light under the driving of its corresponding pixel circuit 100a. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited to this. The number of pixel units included in a pixel and the light output of each pixel unit can be determined according to needs.

For example, as illustrated in FIG. 6A, a gate electrode T20 of the data writing transistor T2 is connected to the gate line GT, a first electrode T21 of the data writing transistor T2 is connected to the data line DT, and a second electrode T22 of the data writing transistor T2 is connected to a first electrode T11 of the driving transistor T1.

For example, as illustrated in FIG. 6A, the pixel circuit 100a further includes the threshold compensation transistor T3, a gate electrode T30 of the threshold compensation transistor T3 is connected to the gate line GT, a first electrode T31 of the threshold compensation transistor T3 is connected to a second electrode T12 of the driving transistor T1, and a second electrode T32 of the threshold compensation transistor T3 is connected to a gate electrode T10 of the driving transistor T1.

For example, as illustrated in FIG. 6A, the display panel further includes the light-emitting control signal line EML, and the pixel circuit 100a further includes the first light-emitting control transistor T4 and the second light-emitting control transistor T5. A gate electrode T40 of the first light-emitting control transistor T4 is connected to the light-emitting control signal line EML, a first electrode T41 of the first light-emitting control transistor T4 is connected to the first power supply line PL1, and a second electrode T42 of the first light-emitting control transistor T4 is connected to the first electrode T11 of the driving transistor T1. A gate electrode T50 of the second light-emitting control transistor T5 is connected to the light-emitting control signal line EML, a first electrode T51 of the second light-emitting control transistor T5 is connected to the second electrode T12 of the driving transistor T1, and a second electrode T52 of the second light-emitting control transistors T5 is connected to a first electrode E1 of the light-emitting element 100b.

As illustrated in FIG. 6A, the first reset transistor T6 is connected to the gate electrode T10 of the driving transistor T1 and is configured to reset the gate electrode of the driving transistor T1, and the second reset transistor T7 is connected to the first electrode E1 of the light-emitting element 100b and is configured to reset the first electrode E1 of the light-emitting element 100b. The first initialization signal line INT1 is connected to the gate electrode of the driving transistor T1 through the first reset transistor T6. The second initialization signal line INT2 is connected to the first electrode E1 of the light-emitting element 100b through the second reset transistor T7. For example, the first initialization signal line INT1 and the second initialization signal line INT2 are connected to each other and are input with the same initialization signal, but it is not limited to this. In some embodiments, the first initialization signal line INT1 and the second initialization signal line INT2 may also be insulated from each other and configured to input signals respectively.

For example, as illustrated in FIG. 6A, a first electrode T61 of the first reset transistor T6 is connected to the first initialization signal line INT1, a second electrode T62 of the first reset transistor T6 is connected to the gate electrode T10 of the driving transistor T1, a first electrode T71 of the second reset transistor T7 is connected to the second initialization signal line INT2, and a second electrode T72 of the second reset transistor T7 is connected to the first electrode E1 of the light-emitting element 100b. For example, as illustrated in FIG. 6A, a gate electrode T60 of the first reset transistor T6 is connected to the first reset control signal line RST1, and a gate electrode T70 of the second reset transistor T7 is connected to the second reset control signal line RST2.

As illustrated in FIG. 6A, the first power supply line PL1 is configured to provide the first voltage signal VDD to the pixel circuit 100a. The pixel circuit further includes the storage capacitor Cst, a first electrode Ca of the storage capacitor Cst is connected to the gate electrode T10 of the driving transistor T1, and a second electrode Cb of the storage capacitor Cst is connected to the first power supply line PL1.

For example, as illustrated in FIG. 6A, the display panel further includes the second power supply line PL2, and the second power supply line PL2 is connected to a second electrode 201 of the light-emitting element 100b.

FIG. 6A illustrates a first node N1, a second node N2, a third node N3, and a fourth node N4. For example, in some embodiments, referring to FIG. 5C, FIG. 5E, and FIG. 6A, a capacitor is formed between the first node N1 and the conductive line L1, and a capacitor is formed between the conductive line L1 and the fourth node N4, that is, the conductive line L1 is coupled with the first node N1 and the fourth node N4, respectively, resulting in brightness differences and display defects (for example, forming stripes (Mura)), which affects the display quality.

As illustrated in FIG. 6B, the pixel circuit includes the driving transistor T1, and the driving transistor includes the gate electrode T10. Referring to FIG. 6B and FIG. 6C, the second electrode Cb of the storage capacitor Cst has an opening OPN1, and one terminal of the connecting electrode CE1 is connected to the gate electrode T10 of the driving transistor T1 through the opening OPN1. The connection electrode CE1 may also be referred to as a first gate signal line SL1. As illustrated in FIG. 6B, the first gate signal line SL1 is connected to the gate electrode T10 of the driving transistor T1.

As illustrated in FIG. 6B, the first gate signal line SL1 is connected to the second gate signal line SL2. The gate electrode T10 of the driving transistor T1, the first gate signal line SL1, and the second gate signal line SL2 constitute a gate signal portion PT1. The potentials on the gate signal portion PT1 are the same. Of course, in other embodiments, the second gate signal line SL2 may not be provided, in this case, the gate electrode T10 of the driving transistor T1 and the first gate signal line SL1 constitute the gate signal portion PT1. For example, the second gate signal line SL2 is the second electrode T62 of the first reset transistor T6.

Referring to FIG. 6B and FIG. 6C, in order to stabilize the potentials on the gate signal portion PT1, the display panel provided by the embodiment of the present disclosure provides a shield electrode SE and a constant voltage line L0, and the constant voltage line L0 is configured to provide a constant voltage to the pixel circuit. The shield electrode SE is connected to the constant voltage line L0, so that the voltage on the shield electrode SE is stable and can play a shielding role to prevent the conductive line L1 from affecting the potentials on the gate signal portion PT1. The orthographic projection of the first gate signal line SL1 on the base substrate BS falls within the orthographic projection of the shield electrode SE on the base substrate BS.

Referring to FIG. 6B to FIG. 6D, in order to make the shield electrode play a better shielding effect and increase the shielding amount, the orthographic projection of the first gate signal line SL1 on the base substrate BS completely falls within the orthographic projection of the shield electrode SE on the base substrate BS.

For example, in order to reduce display defects (mura) and improve the display effect, the distance between a boundary of the orthographic projection of the first gate signal line SL1 on the base substrate BS and a boundary of the orthographic projection of the shield electrode SE on the base substrate BS is greater than or equal to 1.75 μm. Because the area occupied by the pixel unit is limited, the distance of the shield electrode SE beyond the first gate signal line SL1 can be limited. For example, in some embodiments, in order to obtain a better shielding effect, the distance between the boundary of the orthographic projection of the first gate signal line SL1 on the base substrate BS and the boundary of the orthographic projection of the shield electrode SE on the base substrate BS is greater than or equal to 2.33 μm.

As illustrated in FIG. 6B, the display panel further includes a block BK, and the block BK is connected to the first power supply line PL1. The threshold compensation transistor T3 includes a first channel CN1 and a second channel CN2, and the first channel CN1 and the second channel CN2 are connected by a conductive connection portion CP. The orthographic projection of the block BK on the base substrate BS at least partially overlaps with the orthographic projection of the conductive connection portion CP of the threshold compensation transistor T3 on the base substrate BS. As illustrated in FIG. 6B, the block BK of the pixel unit of the adjacent column is used to shield the conductive connection portion CP of the threshold compensation transistor T3 of the pixel unit of the current column.

Figure 6G:
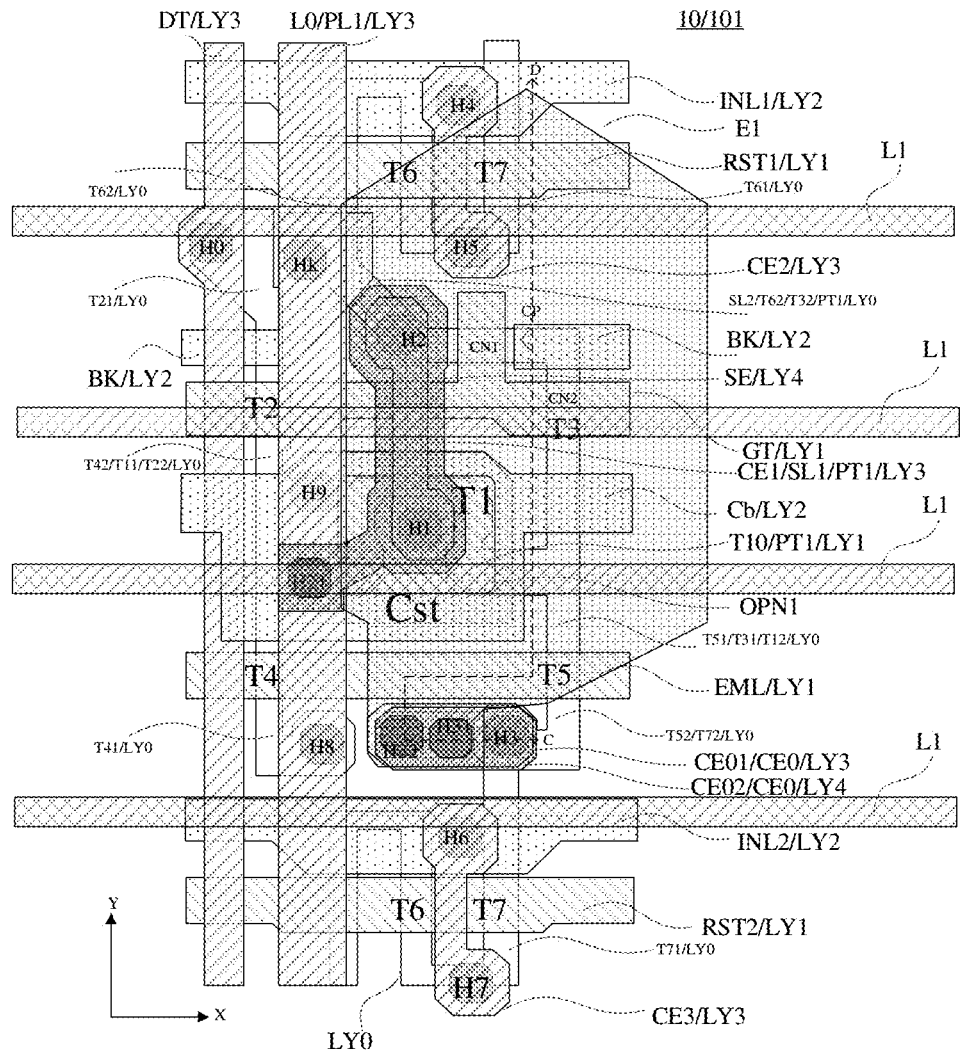
FIG. 6G is a partial schematic diagram of a display panel provided by an embodiment of the present disclosure.
Figure 6H:
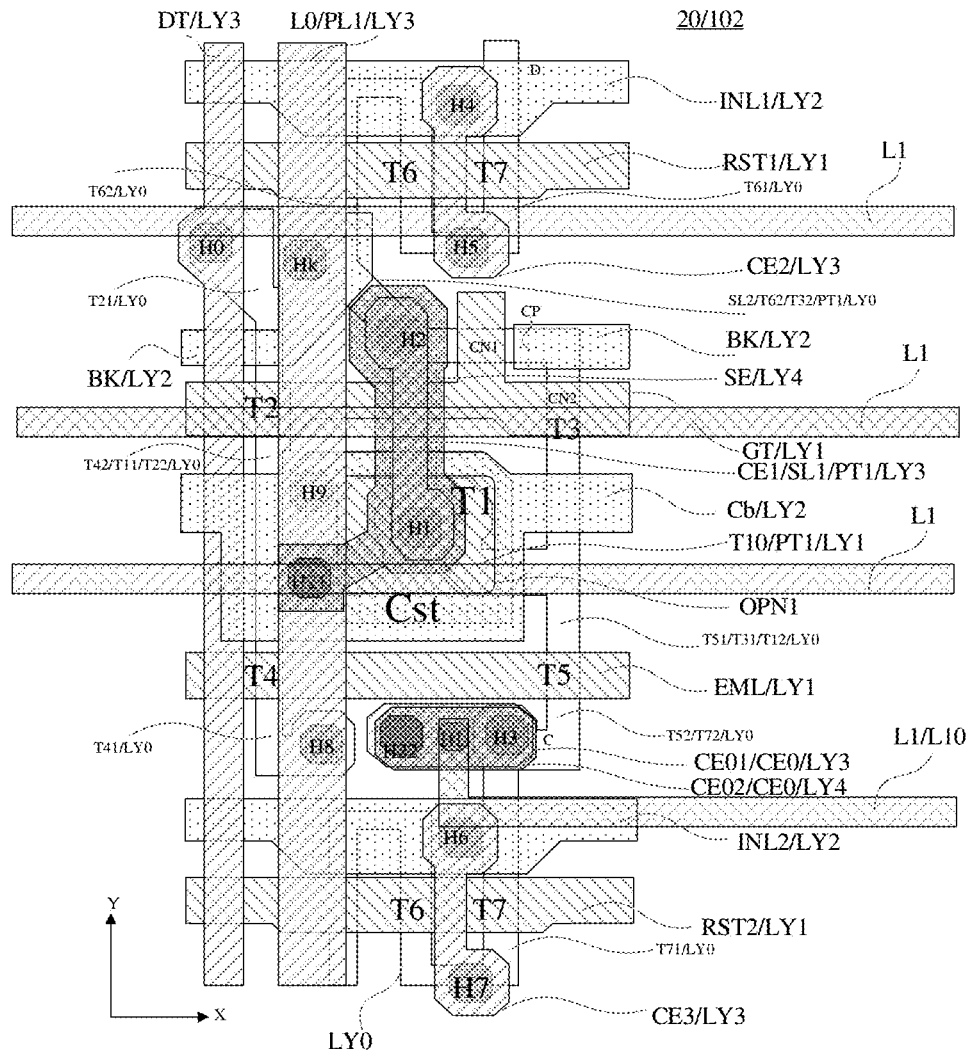
FIG. 6H is a partial schematic diagram of a display panel provided by an embodiment of the present disclosure.
Figure 7A:
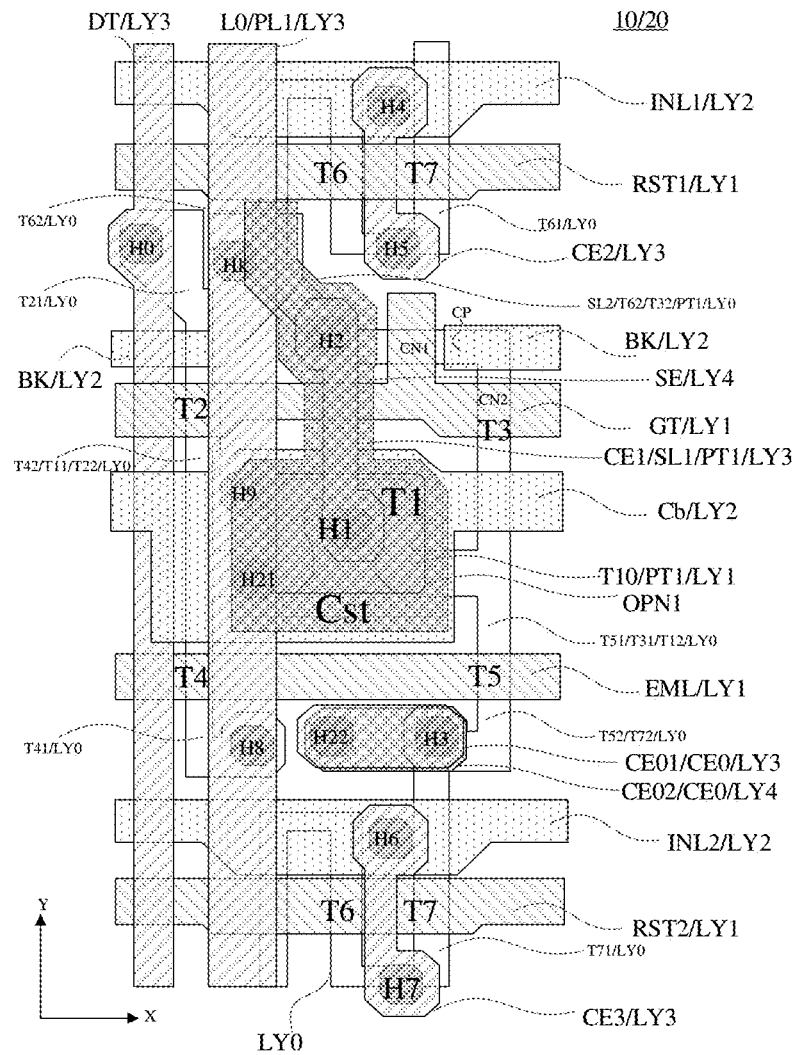
FIG. 7A is a layout diagram of a first pixel circuit or a second pixel circuit in a display panel provided by an embodiment of the present disclosure.

For example, as illustrated in FIG. 6B, FIG. 6G, and FIG. 6H, in the case where the display panel includes the second gate signal line SL2, the second gate signal line SL2 is connected to the first gate signal line SL1, and the orthographic projection of the second gate signal line SL2 on the base substrate BS falls within the orthographic projection of the block BK on the base substrate BS. For further example, the boundary of the orthographic projection of the block BK on the base substrate BS exceeds the boundary of the orthographic projection of the second gate signal line SL2 on the base substrate BS. For example, the boundary of the orthographic projection of the block BK on the base substrate BS exceeds the boundary of the orthographic projection of the second gate signal line SL2 on the base substrate BS by a distance greater than or equal to 1.75 µm. For example, the boundary of the orthographic projection of the block BK on the base substrate BS exceeds the boundary of the orthographic projection of the second gate signal line SL2 on the base substrate BS by a distance greater than or equal to 2.33 µm. Of course, in other embodiments, the shield electrode SE can also be used to replace the role of the block BK, or the orthographic projection of the second gate signal line SL2 on the base substrate BS not only falls within the orthographic projection of the block BK on the base substrate BS, but also falls within the orthographic projection of the shield electrode SE on the base substrate BS (as illustrated in FIG. 7A).

For example, the material of the first gate signal line SL1 is different from the material of the second gate signal line SL2. For example, the material of the first gate signal line SL1 includes a metal, and the material of the second gate signal line SL2 includes a conductive material formed by conducting a semiconductor material.

For example, as illustrated in FIG. 6B and FIG. 6D, in order to save wiring, the first power supply line PL1 serves as the constant voltage line L0. In other embodiments, in order to save wiring, the first initialization signal line INL1 can also be used as the constant voltage line or the second initialization signal line INL2 can also be used as the constant voltage line. Examples of the constant voltage line L0 are not limited to the first power supply line PL1, the first initialization signal line INL1, and the second initialization signal line INL2, and any signal line that provides a constant voltage in the pixel circuit can be used as the constant voltage line L0. The embodiment of the present disclosure takes the first power supply line PL1 as the constant voltage line L0 as an example for description, and in the case where a signal line that provides a constant voltage other than the first power supply line PL1 is used as the constant voltage line L0, the shape of the shield electrode SE may be adjusted so that it is connected to the signal line supplying a constant voltage.

As illustrated in FIG. 6F, the conductive line L1 includes a first portion L1a, a second portion L1b, and a third portion L1c. Both the first portion L1a and the third portion L1c extend along the second direction Y, and the second portion L1b extends along the first direction X. For example, the first portion L1a and the third portion L1c are located in the same conductive line pattern layer, and the second portion L1b is located in another conductive line pattern layer. The gray-filled regions in FIG. 6F represent via holds used to connect different parts of the conductive line.

FIG. 6F illustrates a via hole Ha and a via hole Hb. The first portion L1a and the second portion L1b are connected by the via hole Ha that penetrates the insulating layer, and the second portion L1b and the third portion L1c are connected by the via hole Hb that penetrates the insulating layer. For example, FIG. 6F illustrates three conductive lines L1, and the conductive line L10 and the conductive line L100 have a similar structure.

Of course, in other embodiments, the entire conductive line may be located on the same conductive line pattern layer. That is, the first portion L1a, the second portion L1b, and the third portion L1c are all located on the same conductive line pattern layer. For example, in other embodiments, three adjacent conductive lines L1 in the second direction Y are respectively located on the first conductive line pattern layer, the second conductive line pattern layer, and the third conductive line pattern layer. The setting of the conductive lines can be determined according to needs.

As illustrated in FIG. 6F, the orthographic projection of the conductive line L1 on the base substrate BS partially overlaps with the orthographic projection of the pixel circuit (the first pixel circuit 10) of the first pixel unit 101 on the base substrate BS. As illustrated in FIG. 6F, the shield electrode SE is located between the conductive line L1 and the first gate signal line SL1. In the embodiment of the present disclosure, after the pixel circuit is formed, the shield electrode SE is formed, then the conductive line L1 is formed, and then the light-emitting element is formed, so that the shield electrode SE is located between the conductive line L1 and the first gate signal line SL1, and the shield electrode SE is located between the conductive line L1 and the gate electrode T10 of the driving transistor (referring to FIG. 6G and FIG. 6H).

For clarity of illustration, only a part of the structure of the pixel circuit is illustrated in FIG. 6F. The conductive line L1 is disposed in the auxiliary region, and the conductive line L1 is not disposed in the region other than the auxiliary region of the first display region, so that the orthographic projection of the pixel circuit (the first pixel circuit), which is in the region of the first display region except the auxiliary region, on the base substrate BS does not overlap with the orthographic projection of the conductive line L1 on the base substrate BS.

As illustrated in FIG. 6F, the orthographic projection of the conductive line L1 on the base substrate BS partially overlaps with the orthographic projection of the first gate signal line SL1 in the pixel circuit of the first pixel unit 101 on the base substrate BS.

FIG. 6F illustrates a via hole HL and a via hole HE. As illustrated in FIG. 6F, one terminal of the conductive line L10 is connected to the second pixel circuit 20 through the via hole HL, and the other terminal of the conductive line L10 is connected to the first electrode E1 of the second light-emitting element 40 through the via hole HE.

Referring to FIG. 6C and FIG. 6E, a buffer layer BL is disposed on the base substrate BS, an isolation layer BR is disposed on the buffer layer BL, an active layer LY0 is disposed on the isolation layer BR, a first insulating layer ISL1 is disposed on the active layer LY0, a first conductive layer LY1 is disposed on the first insulating layer ISL1, a second insulating layer ISL2 is disposed on the first conductive layer LY1, a second conductive layer LY2 is disposed on the second insulating layer ISL2, a third insulating layer ISL3 is disposed on the second conductive layer LY2, and a third conductive layer LY3 is disposed on the third insulating layer ISL3. The third conductive layer LY3 includes a connecting electrode CE01, and the connecting electrode CE01 is connected to the second electrode T52 of the second light-emitting control transistor T5 through a via hole H3 penetrating the first insulating layer ISL1, the second insulating layer ISL2, and the third insulating layer ISL3. A fourth insulating layer ISL4 and a fifth insulating layer ISL5 are disposed on the third conductive layer LY3, and a fourth conductive layer LY4 is disposed on the fourth insulating layer ISL4 and the fifth insulating layer ISL5. The fourth conductive layer LY4 includes a connecting electrode CE02, and the connecting electrode CE02 is connected to the connecting electrode CE01 through a via hole H22 that penetrates the fourth insulating layer ISL4 and the fifth insulating layer ISL5. A sixth insulating layer ISL6 is disposed on the fourth conductive layer LY4, and the light-emitting element 100b (the second light-emitting element 30) is connected to the connection electrode CE02 through a via hole H31 (as illustrated in FIG. 6D and FIG. 6E) penetrating the sixth insulating layer ISL6. The light-emitting element 100b includes a first electrode E1, a second electrode E2, and a light-emitting function layer FL located between the first electrode E1 and the second electrode E2. For example, the connecting element CE0 includes the connecting electrode CE01 and the connecting electrode CE02.

As illustrated in FIG. 6B, one terminal of the connecting electrode CE1 is connected to the gate electrode T10 of the driving transistor T1 through a via hole H1, and the other terminal of the connecting electrode CE1 is connected to the second electrode T62 of the first reset transistor T6 through a via hole H2. One terminal of the connecting electrode CE2 is connected to the first initialization signal line INL1 through a via hole H4, and the other terminal of the connecting electrode CE2 is connected to the first electrode T61 of the first reset transistor T6 through a via hole H5. One terminal of the connecting electrode CE3 is connected to the second initialization signal line INL2 through a via hole H6, and the other terminal of the connecting electrode CE3 is connected to the first electrode T71 of the second reset transistor T7 through a via hole H7. The first power supply line PL1 is connected to the first electrode T41 of the first light-emitting control transistor T4 through a via hole H8. The first power supply line PL1 is connected to the second electrode Cb of the storage capacitor Cst through a via hole H9. The first power supply line PL1 is connected to the block BK through a via hole Hk. The data line DT is connected to the first electrode T21 of the data writing transistor T2 through a via hole H0.

For example, in the manufacturing process of the display panel, a self-aligned process is adopted, and a semiconductor patterned layer is subject to a conductor process by using the first conductive layer LY1 as a mask. The semiconductor pattern layer can be formed by patterning a semiconductor film. For example, the semiconductor pattern layer is heavily doped by ion implantation, so that the portion of the semiconductor pattern layer that is not covered by the first conductive layer LY1 is conducted, and a source electrode region (the first electrode T11) and a drain electrode region (the second electrode T12) of the driving transistor T1, a source electrode region (the first electrode T21) and a drain electrode region (the second electrode T22) of the data writing transistor T2, a source electrode region (the first electrode T31) and a drain electrode region (the second electrode T32) of the threshold compensation transistor T3, a source electrode region (the first electrode T41) and a drain electrode region (the second electrode T42) of the first light-emitting control transistor T4, a source electrode region (the first electrode T51) and a drain electrode region (the second electrode T52) of the second light-emitting control transistor T5, a source electrode region (the first electrode T61) and a drain electrode region (the second electrode T62) of the first reset transistor T6, and a source electrode region (the first electrode T71) and a drain elec-trode region (the second electrode T72) of the second reset transistor T7 are formed. The portion of the semiconductor pattern layer covered by the first conductive layer LY1 retains semiconductor characteristics, and can form a channel region of the driving transistor T1, a channel region of the data writing transistor T2, a channel region of the threshold compensation transistor T3, a channel region of the first light-emitting control transistor T4, a channel region of the second light-emitting control transistor T5, a channel region of the first reset transistor T6, and a channel region of the second reset transistor T7. For example, as illustrated in FIG. 6B, the second electrode T72 of the second reset transistor T7 and the second electrode T52 of the second light-emitting control transistor T5 are formed as an integrated structure; the first electrode T51 of the second light-emitting control transistor T5, the second electrode T12 of the driving transistor T1, and the first electrode T31 of the threshold compensation transistor T3 are formed as an integrated structure; the first electrode T11 of the driving transistor T1, the second electrode T22 of the data writing transistor T2, and the second electrode T42 of the first light-emitting control transistor T4 are formed as an integrated structure; and the second electrode T32 of the threshold compensation transistor T3 and the second electrode T62 of the first reset transistor T6 are formed as an integrated structure. In some embodiments, as illustrated in FIG. 6B, the first electrode T71 of the second reset transistor T7 and the first electrode T61 of the first reset transistor T6 may be formed as an integrated structure.

For example, the channel regions of the transistors used in the embodiment of the present disclosure may adopt monocrystalline silicon, polycrystalline silicon (such as low temperature polysilicon), or metal oxide semiconductor materials (such as IGZO, AZO, etc.). In one embodiment, the transistors are all P-type low temperature polysilicon (LTPS) thin film transistors. In another embodiment, the threshold compensation transistor T3 and the first reset transistor T6, that are directly connected to the gate electrode of the driving transistor T1, are metal oxide semiconductor thin film transistors, that is, the channel material of the transistor is a metal oxide semiconductor material (such as IGZO, AZO, etc.). The metal oxide semiconductor thin film transistor has a lower leakage current, which can help reduce the leakage current of the gate electrode of the driving transistor T1.

For example, the transistors adopted in the embodiments of the present disclosure may include various structures, such as a top gate type, a bottom gate type, or a dual-gate structure. In one embodiment, the threshold compensation transistor T3 and the first reset transistor T6, which are directly connected to the gate electrode of the driving transistor T1, are dual-gate thin film transistors, which can help reduce the leakage current of the gate electrode of the driving transistor T1.

For example, as illustrated in FIG. 6E, the display panel further includes a pixel definition layer PDL and a spacer PS. The pixel definition layer PDL has an opening OPN, and the opening OPN is configured to limit the light-emitting area (light exit region, effective light-emitting area) of the pixel unit. The spacer PS is configured to support a fine metal mask when forming the light-emitting function layer FL.

For example, the opening OPN is the light exit region of the pixel unit. The light-emitting functional layer FL is located on the first electrode E1 of the light-emitting element 100b, and the second electrode E2 of the light-emitting element 100b is located on the light-emitting functional layer FL. As illustrated in FIG. 6E, an encapsulation layer CPS is disposed on the light-emitting element 100b. The encapsulation layer CPS includes a first encapsulation layer CPS1, a second encapsulation layer CPS2, and a third encapsulation layer CPS3. For example, the first encapsulation layer CPS1 and the third encapsulation layer CPS3 are inorganic material layers, and the second encapsulation layer CPS2 is an organic material layer. For example, the first electrode E1 is the anode of the light-emitting element 100b, and the second electrode E2 is the cathode of the light-emitting element 100b, but it is not limited thereto.

FIG. 6G is a partial schematic diagram of a display panel provided by an embodiment of the present disclosure. FIG. 6G illustrates a plurality of conductive lines L1. For example, the conductive line L1 extends along the first direction X, and the plurality of conductive lines L1 are arranged along the second direction Y, but it is not limited thereto. FIG. 6G illustrates four conductive lines L1. However, the number of the conductive lines L1 can be determined as required. The pixel unit illustrated in FIG. 6G is the first pixel unit 101, and the pixel circuit illustrated in FIG. 6G is the first pixel circuit 10. The display panel provided by the embodiment of the present disclosure further includes a first pixel unit 101 that does not overlap with the conductive line L1. For example, the first pixel unit 101 that does not overlap with the conductive line L1 is located in the first display region except the auxiliary region. Each conductive line L1 illustrated in FIG. 6G is used to connect the second pixel circuit 20 and the second light-emitting element 40 respectively located on the left and right sides of the first pixel unit 101.

FIG. 6H is a partial schematic diagram of a display panel provided by an embodiment of the present disclosure. FIG. 6H illustrates a plurality of conductive lines L1. For example, the conductive line L1 extends along the first direction X, and the plurality of conductive lines L1 are arranged along the second direction Y, but it is not limited thereto. FIG. 6G illustrates four conductive lines L1. However, the number of the conductive lines L1 can be determined as required. The pixel unit illustrated in FIG. 6G is the second pixel circuit 20 of the second pixel unit 102. As illustrated in FIG. 6H, one of the conductive lines L1 is connected to the second pixel unit 102, and the remaining conductive lines L1 are not connected to the second pixel unit 102. For example, the conductive line L10 (one of the plurality of conductive lines L1) is connected to the connection element CE0 of the second pixel unit 102 through the via hole HL penetrating the insulating layer. For further example, the conductive line L10 is connected to the connection electrode CE02 of the connection element CE0 of the second pixel unit 102 through the via hole HL penetrating the insulating layer. The conductive line L10 is used to connect to the first electrode E1 of the second light-emitting element 40 located in the second display region.

FIG. 7A is a layout diagram of a first pixel circuit or a second pixel circuit in a display panel provided by an embodiment of the present disclosure. For example, as illustrated in FIG. 7A, the orthographic projection of the gate electrode T10 of the driving transistor T1 on the base substrate BS falls within the orthographic projection of the shield electrode SE on the base substrate BS.

For example, as illustrated in FIG. 7A, in the case where the display panel includes the second gate signal line SL2, the second gate signal line SL2 is connected to the first gate signal line SL1, and the orthographic projection of the second gate signal line SL2 on the base substrate BS also falls within the orthographic projection of the shield electrode SE on the base substrate BS. For further example, the boundary of the orthographic projection of the shield electrode SE on the base substrate BS exceeds the boundary of the orthographic projection of the second gate signal line SL2 on the base substrate BS. For example, the boundary of the orthographic projection of the shield electrode SE on the base substrate BS exceeds the boundary of the orthographic projection of the second gate signal line SL2 on the base substrate BS by a distance greater than or equal to 1.75 μm. For example, the boundary of the orthographic projection of the shield electrode SE on the base substrate BS exceeds the boundary of the orthographic projection of the second gate signal line SL2 on the base substrate BS by a distance greater than or equal to 2.33 μm.

For example, as illustrated in FIG. 7A, the orthographic projections of the gate electrode T10 of the driving transistor T1, the first gate signal line SL1, and the second gate signal line SL2 on the base substrate BS all fall into the orthographic projection of the shield electrode SE on the base substrate BS.

For example, as illustrated in FIG. 7A, the orthographic projection of the shield electrode SE on the base substrate BS partially overlaps with the orthographic projection of the second gate signal line SL2 on the base substrate BS, and the orthographic projection of the block BK on the base substrate BS partially overlaps with the orthographic projection of the second gate signal line SL2 on the base substrate BS. Thus, in the display panel illustrated in FIG. 7A, the shield electrode SE and the block BK form a double-layer shield for the second gate signal line SL2.

For example, as illustrated in FIG. 7A, the orthographic projection of the shield electrode SE on the base substrate BS partially overlaps with the orthographic projection of the block BK on the base substrate BS.

Of course, in other embodiments, the block BK may not be provided, or the orthographic projection of the block BK on the base substrate BS does not overlap with the orthographic projection of the second gate signal line SL2 on the base substrate BS.

Figure 7B:
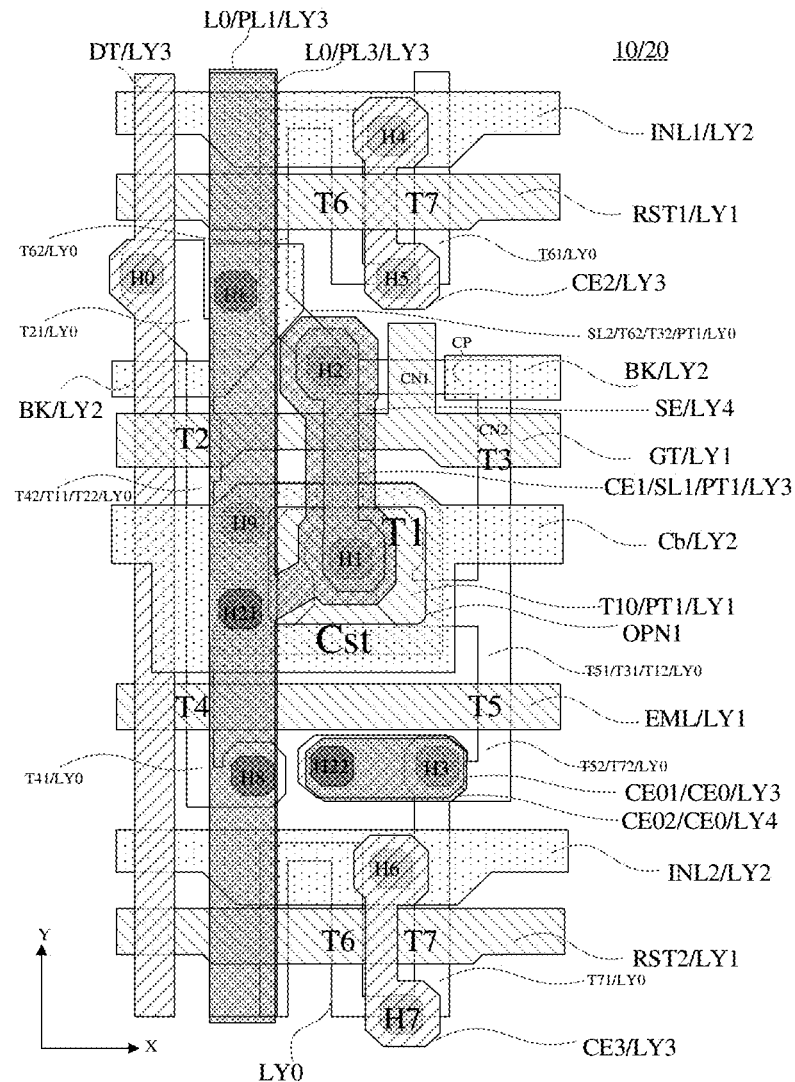
FIG. 7B is a layout diagram of a first pixel circuit or a second pixel circuit in a display panel provided by an embodiment of the present disclosure.

FIG. 7B is a layout diagram of a first pixel circuit or a second pixel circuit in a display panel provided by an embodiment of the present disclosure. As illustrated in FIG. 7B, the fourth conductive layer LY4 further includes a third power supply line PL3. The third power supply line PL3 is formed integrally with the shield electrode SE. The third power supply line PL3 is connected to the first power supply line PL1 through a via hole H21 to form a parallel structure to reduce resistance. The third power supply line PL3 extends along the second direction Y. As illustrated in FIG. 7B, the size of the third power supply line PL3 in the second direction Y is larger than the size of the shield electrode SE in the second direction Y.

For example, as illustrated in FIG. 6B, FIG. 6D, and FIG. 7B, the orthographic projection of the block BK on the base substrate BS partially overlaps with the orthographic projection of the second gate signal line SL2 on the base substrate BS, and the orthographic projection of the shield electrode SE on the base substrate BS partially overlaps with the orthographic projection of the first gate signal line SL1 on the base substrate BS, so that the block BK and the shield electrode SE jointly function as a shield for the gate signal portion PT1. Of course, in other embodiments, the block BK may not be provided, or the orthographic projection of the block BK on the base substrate BS does not overlap with the orthographic projection of the second gate signal line SL2 on the base substrate BS.

For example, as illustrated in FIG. 6B, FIG. 6D, and FIG. 7B, the block BK on the left extends to a pixel unit on the left side of the pixel unit illustrated in the figure, in order to shield the conductive connection portion CP of the threshold compensation transistor T3, while the block BK on the right is extended from the block BK connected to a pixel unit on the right side of the pixel unit illustrated in the figure.

As illustrated in FIG. 6B, FIG. 6D, FIG. 7A, and FIG. 7B, the channel of each transistor as well as the first electrode and the second electrode on both sides of the channel are located in the active layer LY0; the first reset control signal line RST1, the gate line GT, the gate electrode T10 of the driving transistor (the first electrode Ca of the storage capacitor Cst), the light-emitting control signal line EML and the second reset control signal line RST2 are located in the first conductive layer LY1; the first initialization signal line INL1, the second electrode Cb of the storage capacitor Cst, and the second initialization signal line INL2 are located in the second conductive layer LY2; the data line DT, the first power supply line PL1, the connecting electrode CE1, the connecting electrode CE2, the connecting electrode CE3, and the connecting electrode CE01 are located in the third conductive layer LY3; and the shield electrode SE is located in the fourth conductive layer LY4. As illustrated in FIG. 7B, the shield electrode SE and the third power supply line PL3 are located in the fourth conductive layer LY4.

As illustrated in FIG. 6B, FIG. 6D, FIG. 7A, and FIG. 7B, the first initialization signal line INL1, the first reset control signal line RST1, the gate line GT, the light-emitting control signal line EML, the second initialization signal line INL2, and the second reset control signal lines RST2 all extend along the first direction X. As illustrated in FIG. 6B, FIG. 6D, FIG. 7A, and FIG. 7B, the data line DT and the first power supply line PL1 both extend along the second direction Y.

In the embodiments of the present disclosure, an orthographic projection of an element A on the base substrate BS falls within an orthographic projection of an element B on the base substrate BS means that the orthographic projection of the element A on the base substrate BS completely falls into the orthographic projection of the element B on the base substrate BS, that is, the orthographic projection of the element B on the base substrate BS covers the orthographic projection of the element A on the base substrate BS, and the area of the orthographic projection of the element A on the base substrate BS is less than or equal to the area of the orthographic projection of the element B on the base substrate BS.

For example, in some embodiments of the present disclosure, each pixel circuit 100a is provided with any one of the shield electrodes SE described above. That is, both the first pixel circuit 10 of the first pixel unit 101 and the second pixel circuit 20 of the second pixel unit 102 are provided with any one of the shield electrodes SE described above. FIG. 6F illustrates that the first pixel circuit 10 of the first pixel unit 101 includes the shield electrode SE, and the second pixel circuit 20 of the second pixel unit 102 includes the shield electrode SE. Of course, the shield electrode SE may also take other forms, for example, the shield electrode illustrated in FIG. 6F can also be replaced with the shield electrode illustrated in FIG. 7A or the shield electrode illustrated in FIG. 7B.

For example, the transistors in the pixel circuit of the embodiment of the present disclosure are all thin film transistors. For example, the first conductive layer LY1, the second conductive layer LY2, the third conductive layer LY3, and the fourth conductive layer LY4 are all made of metal materials. For example, the first conductive layer LY1 and the second conductive layer LY2 are formed of metal materials such as nickel and aluminum, etc., but are not limited thereto. For example, the third conductive layer LY3 and the fourth conductive layer LY4 are formed of materials such as titanium, aluminum, etc., but are not limited thereto. For example, the third conductive layer LY3 and the fourth conductive layer LY4 are respectively a structure formed by three sub-layers of Ti/AL/Ti, but are not limited thereto. For example, the base substrate may be a glass substrate or a polyimide substrate, but it is not limited to this, and can be selected as required. For example, the buffer layer BL, the isolation layer BR, the first insulating layer ISL1, the second insulating layer ISL2, the third insulating layer ISL3, the fourth insulating layer IS4, the fifth insulating layer ISL5, and the sixth insulating layer ISL6 are all made of insulating materials. The materials of the first electrode E1 and the second electrode E2 of the light-emitting element can be selected as required. In some embodiments, the first electrode E1 may adopt at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 may adopt a low work function metal, for example at least one of magnesium and silver, but is not limited thereto.

For example, referring to the layout diagrams and the cross-sectional views of the embodiment of the present disclosure, the display panel provided by at least one embodiment of the present disclosure can be manufactured by the following method.

(1) The buffer layer BL and the isolation layer BR are formed on the base substrate BS.
(2) A semiconductor film is formed on the isolation layer BR.
(3) The semiconductor film is patterned to form a semiconductor pattern layer.
(4) A first insulating film is formed on the semiconductor pattern layer.
(5) A first conductive film is formed on the first insulating film, and the first conductive film is patterned to form the first conductive layer LY1.
(6) The semiconductor pattern layer is doped by using the first conductive layer LY1 as a mask, so as to form the active layer LY0.
(7) A second insulating film is formed on the first conductive layer LY1.
(8) A second conductive film is formed on the second insulating layer ISL2, and the second conductive film is patterned to form the second conductive layer LY2.

(9) A third insulating film is formed on the second conductive layer LY2.

(10) At least one of the first insulating film, the second insulating film, and the third insulating film is patterned to simultaneously form via holes, the first insulating layer ISL1, the second insulating layer ISL2, and the third insulating layer ISL3.

(11) A third conductive film is formed, and the third conductive film is patterned to form the third conductive layer LY3. The components in the third conductive layer LY3 are connected to the components located under the third conductive layer LY3 through the via holes.

(12) A fourth insulating film and a fifth insulating film are formed, and the fourth insulating film and the fifth insulating film are patterned to simultaneously form via holes, the fourth insulating layer ISL4 and the fifth insulating layer ISL5.

(13) A fourth conductive film is formed, and the fourth conductive film is patterned to form the fourth conductive layer LY4.

(14) At least one insulating layer is formed and at least one transparent conductive layer is formed, and the transparent conductive layer includes the conductive lines L1.

(15) The first electrode E1 of the light-emitting element is formed.

(16) The pixel definition layer PDL and the spacer PS are formed.

(17) The light-emitting function layer FL is formed.

(18) The second electrode E2 of the light-emitting element is formed.

(19) The encapsulation layer CPS is formed.

At least one embodiment of the present disclosure provides a display device including any one of the above-mentioned display panels.

Figure 8A:
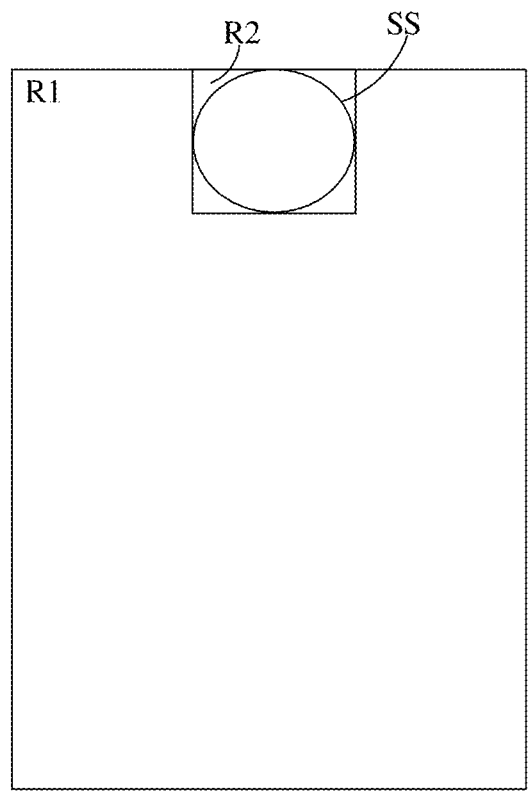
FIG. 8A and FIG. 8B are schematic diagrams of a display device provided by an embodiment of the present disclosure.
Figure 8B:
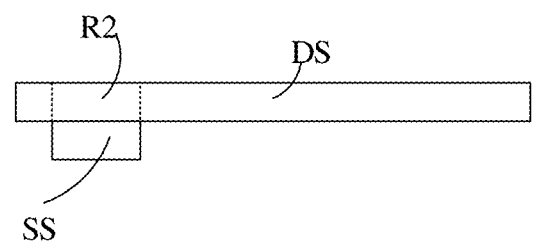

FIG. 8A and FIG. 8B are schematic diagrams of a display device provided by an embodiment of the disclosure. As illustrated in FIG. 8A and FIG. 8B, a sensor SS is located on one side of a display panel DS and located in a second display region R2. The ambient light propagates through the second display region R2 and can be sensed by the sensor SS. As illustrated in FIG. 8B, the side of the display panel where the sensor SS is not provided is a display side, and images can be displayed on the display side.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

Figure 9:
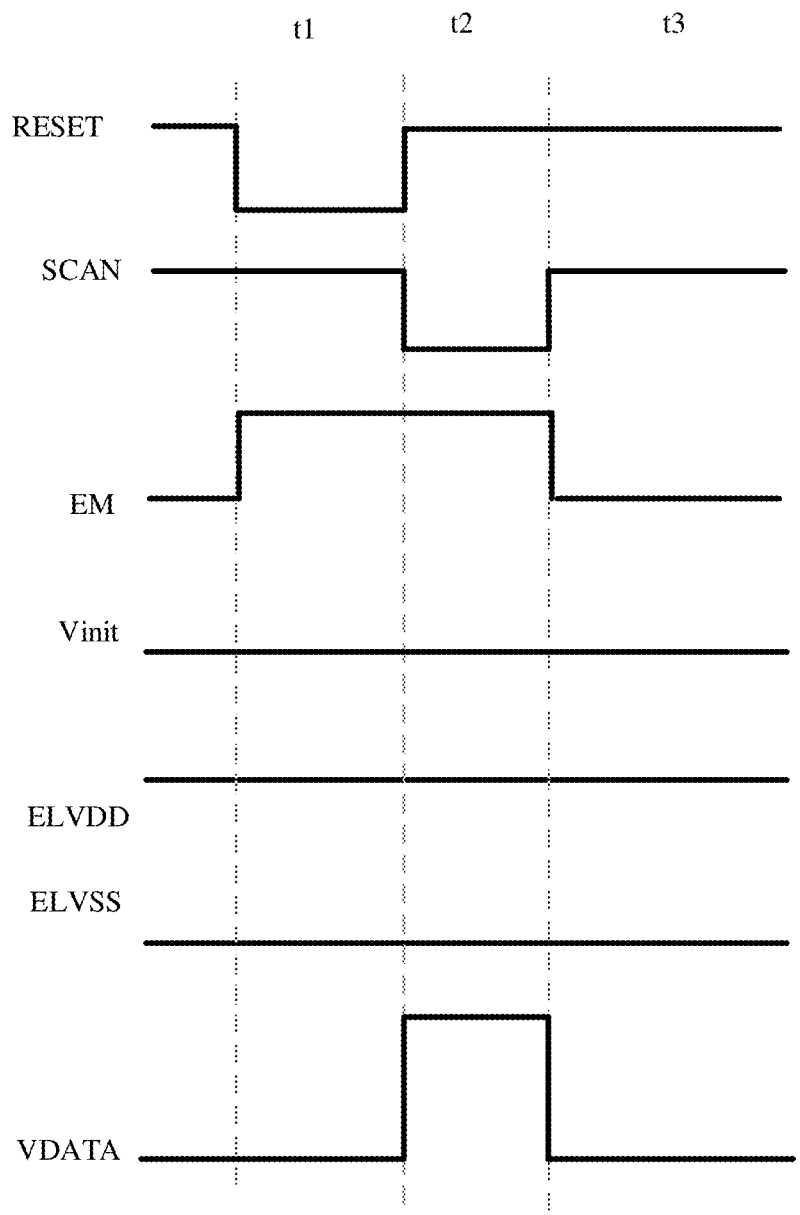
FIG. 9 is a working timing diagram of the pixel circuit illustrated in FIG. 6A.

FIG. 9 is a working timing diagram of the pixel circuit illustrated in FIG. 6A. As illustrated in FIG. 9, during one frame of display period, the driving method of the pixel unit includes a first reset stage t1, a data writing, threshold compensation and second reset stage t2, and a light-emitting stage t3. When the reset control signal RESET is at a low level, the gate electrode of the driving transistor T1 is reset, and when the scan signal SCAN is at a low level, the first electrode E1 (for example, the anode) of the light-emitting element 100b is reset. For example, as illustrated in FIG. 6A, when the scan signal SCAN is at a low level, the data voltage VDATA is written, and the threshold voltage Vth of the driving transistor T1 is obtained at the same time, and the data voltage VDADA containing the data information on the data line is stored in the capacitor Cst. When the light-emitting control signal line EML is at a low level, the light-emitting element 100b emits light, and the voltage of the first node N1 (node of the gate electrode) is maintained by the storage capacitor Cst (the light-emitting stability of the light-emitting element 100b). In the driving process of the pixel circuit 10, in the light-emitting stage, the storage capacitor is used to maintain the voltage signal, so that the potential of the signal holding terminal can be kept constant, and a voltage is formed between the gate electrode and the source electrode of the driving transistor, thereby controlling the driving transistor to form a driving current, and then driving the light-emitting element 100b to emit light.

As illustrated in FIG. 9, in the reset stage t1, the light-emitting control signal EM is set to a turn-off voltage, the reset control signal RESET is set to a turn-on voltage, and the scan signal SCAN is set to the turn-off voltage.

As illustrated in FIG. 9, in the data writing, threshold compensation and second reset stage t2, the light-emitting control signal EM is set to the turn-off voltage, the reset control signal RESET is set to the turn-off voltage, and the scan signal SCAN is set to the turn-on voltage.

As illustrated in FIG. 9, in the light-emitting stage t3, the light-emitting control signal EM is set to the turn-on voltage, the reset control signal RESET is set to the turn-off voltage, and the scan signal SCAN is set to the turn-off voltage.

As illustrated in FIG. 9, the first voltage signal ELVDD and the second voltage signal ELVSS are both constant voltage signals. For example, the level of the initialization signal Vinit is between the level of the first voltage signal ELVDD and the level of the second voltage signal ELVSS.

For example, the turn-on voltage in the embodiment of the present disclosure refers to a voltage that can electrically connect the first electrode and the second electrode of the corresponding transistor (the transistor is in ON state), and the turn-off voltage refers to a voltage that can electrically disconnect the first electrode and the second electrode of the corresponding transistor (the transistor is in OFF state). In the case where the transistor is a P-type transistor, the turn-on voltage is a low voltage (for example, 0V), and the turn-off voltage is a high voltage (for example, 5V); and in the case where the transistor is an N-type transistor, the turn-on voltage is a high voltage (for example, 5V) and the turn-off voltage is a low voltage (for example, 0V). The driving waveforms illustrated in FIG. 9 are all explained by taking the P-type transistor as an example. For example, the turn-on voltage is a low voltage (for example, 0V), and the turn-off voltage is a high voltage (for example, 5V), but it is not limited to this.

Please refer to FIG. 6A and FIG. 9 together. In the first reset stage t1, the light-emitting control signal EM is of the turn-off voltage, the reset control signal RESET is of the turn-on voltage, and the scan signal SCAN is of the turn-off voltage. At this time, the first reset transistor T6 is in an ON state, and the second reset transistor T7, the data writing transistor T2, the threshold compensation transistor T3, the first light-emitting control transistor T4, and the second light-emitting control transistor T5 are in an OFF state. The first reset transistor T6 transmits the first initialization signal (initialization voltage Vinit) Vinit1 to the gate electrode of the driving transistor T1, and the first initialization signal Vinit1 is stored by the storage capacitor Cst. The driving transistor T1 is reset, and the data stored during the last (previous frame) light-emitting is erased.

In the data writing, threshold compensation, and second reset stage t2, the light-emitting control signal EM is of the turn-off voltage, the reset control signal RESET is of the turn-off voltage, and the scan signal SCAN is of the turn-on voltage. At this time, the data writing transistor T2 and the threshold compensation transistor T3 are in the ON state, the second reset transistor T7 is in the ON state, and the second reset transistor T7 transmits the second initialization signal (initialization voltage Vinit) Vinit2 to the first electrode E1 of the light-emitting element 100b to reset the light-emitting element 100b. The first light-emitting control transistor T4, the second light-emitting control transistor T5, and the first reset transistor T6 are in the OFF state. At this time, the data writing transistor T2 transmits the data voltage VDATA to the first electrode of the driving transistor T1, that is, the data writing transistor T2 receives the scan signal SCAN and the data voltage VDATA and writes the data voltage VDATA to the first electrode of the driving transistor T1 according to the scan signal SCAN. The threshold compensation transistor T3 is turned on to connect the driving transistor T1 into a diode structure, thereby charging the gate electrode of the driving transistor T1. After the charging is completed, the voltage of the gate electrode of the driving transistor T1 is VDATA+Vth, where VDATA is the data voltage and Vth is the threshold voltage of the driving transistor T1, that is, the threshold compensation transistor T3 receives the scan signal SCAN and performs threshold voltage compensation to the gate electrode of the driving transistor T1 according to the scan signal SCAN. During this stage, the voltage difference across the storage capacitor Cst is ELVDD-VDATA-Vth.

In the light-emitting stage t3, the light-emitting control signal EM is of the turn-on voltage, the reset control signal RESET is of the turn-off voltage, and the scan signal SCAN is of the turn-off voltage. The first light-emitting control transistor T4 and the second light-emitting control transistor T5 are in the ON state, while the data writing transistor T2, the threshold compensation transistor T3, the first reset transistor T6 and the second reset transistor T7 are in the OFF state. The first voltage signal ELVDD is transmitted to the first electrode of the driving transistor T1 through the first light-emitting control transistor T4, the voltage of the gate electrode of the driving transistor T1 is maintained at VDATA+Vth, and the light-emitting current I flows into the light-emitting element 100b through the first light-emitting control transistor T4, the driving transistor T1, and the second light-emitting control transistor T5, and then the light-emitting element 100b emits light. That is, the first light-emitting control transistor T4 and the second light-emitting control transistor T5 receive the light-emitting control signal EM, and control the light-emitting element 100b to emit light according to the light-emitting control signal EM. The light-emitting current I satisfies the following saturation current formula:

$$K(Vgs-Vth)^2 = K(VDATA+Vth-ELVDD-Vth)^2 = K(VDATA-ELVDD)^2$$

Among them, $$K = 0.5\mu_n Cox \frac{W}{L},$$

$\mu_n$ is the channel mobility of the driving transistor, Cox is the channel capacitance per unit area of the driving transistor T1, W and L are the channel width and channel length of the driving transistor T1, respectively, and Vgs is the voltage difference between the gate electrode and the source electrode (that is, the first electrode of the driving transistor T1 in this embodiment) of the driving transistor T1.

It can be seen from the above formula that the current flowing through the light-emitting element 100b is independent of the threshold voltage of the driving transistor T1. Therefore, the pixel circuit compensates the threshold voltage of the driving transistor T1 very well.

For example, the ratio of the duration of the light-emitting stage t3 to the display period of one frame can be adjusted. In this way, the luminous brightness can be controlled by adjusting the ratio of the duration of the light-emitting stage t3 to the display period of one frame. For example, by controlling a scan driving circuit in the display panel or an additional driving circuit, the ratio of the duration of the light-emitting stage t3 to the display period of one frame can be adjusted.

For example, the embodiments of the present disclosure are not limited to the specific pixel circuit illustrated in FIG. 6A, and other pixel circuits that can realize compensation for the driving transistor may be adopted. Based on the description and teaching of the implementation manner in the present disclosure, other setting manners that a person of ordinary skill in the art can easily think of without creative work fall within the protection scope of the present disclosure.

The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the embodiments of the present disclosure, the elements located in the same layer can be formed by the same film layer through the same patterning process. For example, the elements located in the same layer may be located on the surface of the same element away from the base substrate.

It should be noted that, for clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and inkjet. The photolithography process refers to the process including film formation, exposure, development, etc., using photoresist, mask, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display panel, comprising:
   a base substrate;
   a pixel unit, located on the base substrate, the pixel unit comprising a pixel circuit and a light-emitting element, wherein the pixel circuit is configured to drive the light-emitting element, the pixel circuit comprises a driving transistor, and the driving transistor comprises a gate electrode;
   a first gate signal line, connected to the gate electrode of the driving transistor;
   a constant voltage line, configured to provide a first constant voltage to the pixel circuit; and
   a shield electrode, connected to the constant voltage line, wherein an orthographic projection of the first gate signal line on the base substrate falls within an orthographic projection of the shield electrode on the base substrate,
   wherein an orthographic projection of the gate electrode of the driving transistor on the base substrate wholly falls within the orthographic projection of the shield electrode on the base substrate,
   wherein a distance between a boundary of the orthographic projection of the first gate signal line on the base substrate and a boundary of the orthographic projection of the shield electrode on the base substrate is greater than or equal to 1.75 μm.

2. The display panel according to claim 1, wherein the orthographic projection of the shield electrode on the base substrate covers the orthographic projection of the first gate signal line on the base substrate, and an area of the orthographic projection of the shield electrode on the base substrate is larger than an area of the orthographic projection of the first gate signal line on the base substrate.

3. The display panel according to claim 1, further comprising a second gate signal line, wherein the second gate signal line is connected to the first gate signal line, and an orthographic projection of the second gate signal line on the base substrate falls within the orthographic projection of the shield electrode on the base substrate.

4. The display panel according to claim 3, wherein a material of the first gate signal line comprises a metal, and a material of the second gate signal line comprises an electrically conductive material formed by conducting a semiconductor material.

5. The display panel according to claim 1, wherein the pixel circuit further comprises a first reset transistor and a first initialization signal line, the first reset transistor is connected to a second gate signal line, a first electrode of the first reset transistor is connected to the first initialization signal line, and the second gate signal line is multiplexed as a second electrode of the first reset transistor.

6. The display panel according to claim 5, wherein the constant voltage line comprises the first initialization signal line.

7. The display panel according to claim 5, further comprising a first power supply line, wherein the first power supply line is configured to provide a first power supply voltage to the pixel circuit, the pixel circuit further comprises a storage capacitor,
   a first terminal of the storage capacitor is connected to the gate electrode of the driving transistor, and a second terminal of the storage capacitor is connected to the first power supply line.

8. The display panel according to claim 7, wherein the constant voltage line comprises the first power supply line.

9. The display panel according to claim 7, further comprising a third power supply line, wherein the third power supply line is connected in parallel with the first power supply line, the shield electrode and the third power supply line are formed as an integrated structure, and the third power supply line and the first power supply line extend in a same direction.

10. The display panel according to claim 7, further comprising a block, wherein the block is connected to the first power supply line,
    the pixel circuit further comprises a threshold compensation transistor, a first electrode of the threshold compensation transistor is connected to a second electrode of the driving transistor, a second electrode of the threshold compensation transistor is connected to the gate electrode of the driving transistor, and a gate electrode of the threshold compensation transistor is connected to a gate line;
    the gate electrode of the driving transistor is connected to the second electrode of the threshold compensation transistor through the first gate signal line,
    the threshold compensation transistor comprises a first channel and a second channel, and the first channel and the second channel are connected with each other by a conductive connection portion; and
    an orthographic projection of the block on the base substrate at least partially overlaps with an orthographic projection of the conductive connection portion of the threshold compensation transistor on the base substrate.

11. The display panel according to claim 10, wherein the orthographic projection of the block on the base substrate partially overlaps with an orthographic projection of the second gate signal line on the base substrate.

12. The display panel according to claim 1, wherein the display panel comprises a first display region and a second display region, the first display region is located on at least one side of the second display region,
    the pixel unit comprises a first pixel unit and a second pixel unit,
    a pixel circuit and a light-emitting element of the first pixel unit are both located in the first display region,
    a pixel circuit of the second pixel unit is located in the first display region, a light-emitting element of the second pixel unit is located in the second display region,
    the pixel circuit of the second pixel unit is connected to the light-emitting element of the second pixel unit through a conductive line,
    an orthographic projection of the conductive line on the base substrate partially overlaps with an orthographic projection of the pixel circuit of the first pixel unit on the base substrate, and
    the shield electrode is located between the conductive line and the first gate signal line in a direction perpendicular to the base substrate.

13. The display panel according to claim 12, wherein the orthographic projection of the conductive line on the base substrate partially overlaps with an orthographic projection of the first gate signal line, which is located in the pixel circuit of the first pixel unit, on the base substrate.

14. The display panel according to claim 1, further comprising a gate line and a data line, wherein the gate line is configured to provide a scan signal to the pixel circuit, and the data line is configured to provide a data signal to the pixel circuit; and the pixel circuit further comprises a data writing transistor, a gate electrode of the data writing transistor is connected to the gate line, a first electrode of the data writing transistor is connected to the data line, and a second electrode of the data writing transistor is connected to a first electrode of the driving transistor.

15. The display panel according to claim 1, further comprising a second reset control signal line, wherein the pixel circuit further comprises a second reset transistor, a gate electrode of the second reset transistor is connected to the second reset control signal line, a first electrode of the second reset transistor is connected to a second initialization signal line, and a second electrode of the second reset transistor is connected to a first electrode of the light-emitting element.

16. The display panel according to claim 1, further comprising a light-emitting control signal line, wherein the pixel circuit further comprises a first light-emitting control transistor and a second light-emitting control transistor, a gate electrode of the first light-emitting control transistor is connected to the light-emitting control signal line, a first electrode of the first light-emitting control transistor is connected to a first power supply line, and a second electrode of the first light-emitting control transistor is connected to a first electrode of the driving transistor; and a gate electrode of the second light-emitting control transistor is connected to the light-emitting control signal line, a first electrode of the second light-emitting control transistor is connected to a second electrode of the driving transistor, and a second electrode of the second light-emitting control transistor is connected to a first electrode of the light-emitting element.

17. A display device, comprising a display panel, wherein the display panel comprises:

a base substrate;

a pixel unit, located on the base substrate, the pixel unit comprising a pixel circuit and a light-emitting element, wherein the pixel circuit is configured to drive the light-emitting element, the pixel circuit comprises a driving transistor, and the driving transistor comprises a gate electrode;

a first gate signal line, connected to the gate electrode of the driving transistor;

a constant voltage line, configured to provide a first constant voltage to the pixel circuit; and a shield electrode, connected to the constant voltage line, wherein an orthographic projection of the first gate signal line on the base substrate falls within an orthographic projection of the shield electrode on the base substrate, wherein an orthographic projection of the gate electrode of the driving transistor on the base substrate wholly falls within the orthographic projection of the shield electrode on the base substrate, wherein a distance between a boundary of the orthographic projection of the first gate signal line on the base substrate and a boundary of the orthographic projection of the shield electrode on the base substrate is greater than or equal to 1.75 µm.

18. The display device according to claim 17, further comprising a sensor, wherein the sensor is located on one side of the display panel.

* * * * *